(12) United States Patent
Shin et al.

(10) Patent No.: US 9,354,659 B2
(45) Date of Patent: May 31, 2016

(54) TOUCH WINDOW

(71) Applicant: LG INNOTEK CO., LTD., Seoul (KR)

(72) Inventors: Jun Sik Shin, Seoul (KR); Beom Sun Hong, Seoul (KR); Chan Kyu Koo, Seoul (KR); Joon Hyuk Yang, Seoul (KR); Eun Jung Jeon, Seoul (KR); In Tae Kim, Seoul (KR); Jung Ki Lee, Seoul (KR); Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/637,868

(22) Filed: Mar. 4, 2015

(65) Prior Publication Data

US 2015/0253810 A1 Sep. 10, 2015

(30) Foreign Application Priority Data

Mar. 7, 2014 (KR) .................. 10-2014-0026992
Mar. 7, 2014 (KR) .................. 10-2014-0026993

(51) Int. Cl.
| | |
|---|---|
| *G06K 7/10* | (2006.01) |
| *G06F 1/16* | (2006.01) |
| *G06F 3/044* | (2006.01) |
| *G06F 3/041* | (2006.01) |
| *H03K 17/96* | (2006.01) |

(52) U.S. Cl.
CPC *G06F 1/16* (2013.01); *G06F 3/044* (2013.01); *G06F 3/0412* (2013.01); *H03K 17/9622* (2013.01); *G06F 2203/04102* (2013.01); *G06F 2203/04103* (2013.01); *G06F 2203/04112* (2013.01); *H03K 2017/9602* (2013.01)

(58) Field of Classification Search
CPC .......... G06F 3/044; G06F 2203/04103; G06F 3/041; G06F 3/0412; G06F 3/045; G06F 2203/04112; G06F 1/16; G06F 3/0418; G06F 1/1643; B32B 2307/202; B32B 2457/208; B32B 27/06; G02F 1/133345; G02F 1/1333
USPC .......... 235/472.01, 472.02, 472.03, 492, 449, 235/375
See application file for complete search history.

(56) References Cited

U.S. PATENT DOCUMENTS

| | | | | |
|---|---|---|---|---|
| 6,452,331 | B1 * | 9/2002 | Sakurada | B32B 17/10 313/582 |
| 2003/0095332 | A1 * | 5/2003 | Gardner | G02B 1/105 359/599 |
| 2009/0015761 | A1 * | 1/2009 | Stockham | G06F 3/0412 349/96 |
| 2013/0285079 | A1 * | 10/2013 | Hayashi | H01L 33/44 257/88 |
| 2014/0008115 | A1 * | 1/2014 | Sato | B32B 27/08 174/258 |
| 2014/0368761 | A1 * | 12/2014 | Lin | G06F 3/041 349/12 |
| 2015/0022736 | A1 * | 1/2015 | Kim | H05K 1/0274 349/12 |
| 2015/0169110 | A1 * | 6/2015 | Nah | G06F 3/044 345/174 |
| 2015/0205424 | A1 * | 7/2015 | Park | G06F 3/0414 345/174 |

\* cited by examiner

*Primary Examiner* — Thien M Le
(74) *Attorney, Agent, or Firm* — Ked & Associates, LLP

(57) ABSTRACT

Disclosed is a touch window. The touch window includes: a substrate; a sensing electrode on the substrate; and a reflection protective layer on the sensing electrode, wherein a reflectance of the reflection protective layer is higher than 0% and equal to or less than 20%.

16 Claims, 17 Drawing Sheets

US 9,354,659 B2

TOUCH WINDOW

CROSS-REFERENCE TO RELATED APPLICATIONS

This application claims priority under 35 U.S.C. §119 to Korean Application Nos. 10-2014-0026992 and 10-2014-0026993 both filed on Mar. 7, 2014, whose entire disclosures are hereby incorporated by reference.

BACKGROUND

1. Field

The disclosure relates to a touch window.

2. Background

Recently, a touch panel, which performs an input function through the touch of an image displayed on a display device by an input device such as a stylus pen or a hand, has been applied to various electronic appliances.

The touch panel may be typically classified into a resistive touch panel and a capacitive touch panel. In the resistive touch panel, the position of the touch point is detected by detecting the variation of resistance according to the connection between electrodes when pressure is applied to an input device. In the capacitive touch panel, the position of the touch point is detected by detecting the variation in capacitance when a finger of the user is touched on the capacitive touch panel between electrodes. When taking into consideration the convenience of a fabrication scheme and a sensing power, the capacitive touch panel has been spotlighted in a smaller model touch panel recently.

Indium tin oxide (ITO), which is the most widely used material for the transparent electrode of the touch panel, is expensive and is easy to be physically damaged when the substrate is flexed and bent, so that the electrode property is deteriorated. Therefore, the indium tin oxide (ITO) is not suitable for a flexible device. Further, when the ITO is applied to a touch window having a large size, a problem occurs due to high resistance.

In order to solve the problem, researches and studies on an alternative electrode have been actively performed. Specifically, although the substitute for ITO is formed by making the shape of an electrode using a metallic material, visibility is increased due to light reflection, so that a pattern of the electrode may be viewed.

BRIEF DESCRIPTION OF THE DRAWINGS

The embodiments will be described in detail with reference to the following drawings in which like reference numerals refer to like elements wherein.

DETAILED DESCRIPTION

Figure 1:
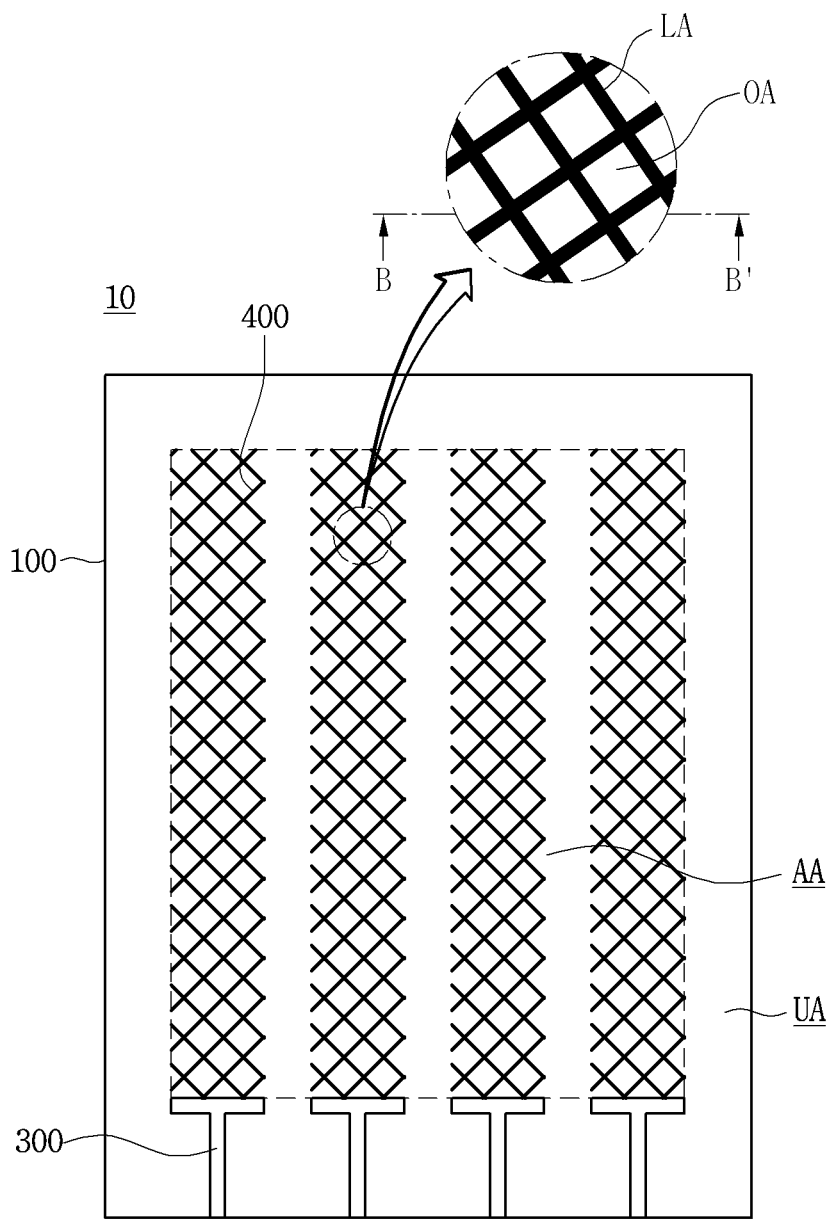
FIG. 1 is a plan view showing a touch window according to one embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Figure 2:
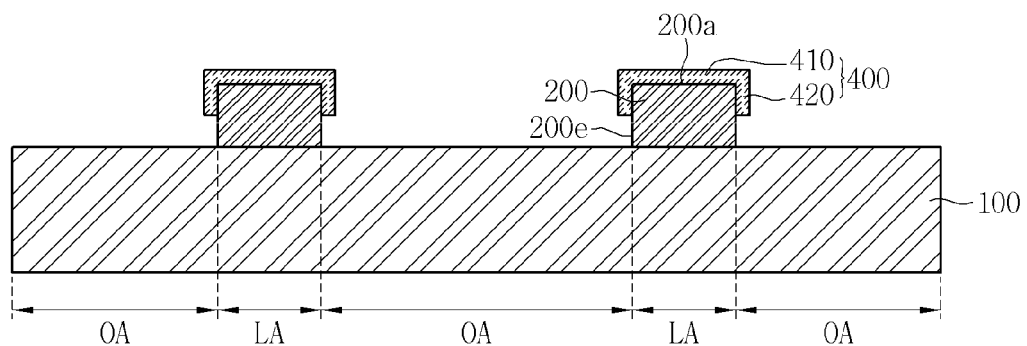
FIG. 2 is a sectional view taken along line B-B' of FIG. 1.

First, a touch window according to an embodiment will be described in detail with reference to FIGS. 1 and 2. FIG. 1 is a plan view showing a touch window according to an embodiment. FIG. 2 is a sectional view taken along line A-A' of FIG. 1.

Referring to FIGS. 1 and 2, a touch window according to an embodiment may include a substrate 100, a sensing electrode 200 and a wire electrode 300.

The substrate 100 may be flexible or rigid. For example, the substrate 100 may include glass or plastic. In detail, the substrate 100 may include chemically tempered glass such as soda lime glass or aluminosilicate glass, or plastic such as polyethylene terephthalate (PET).

The substrate 100 may support the sensing electrode 200 and the wire electrode 300. That is, the substrate 100 may be a support substrate 100 for supporting the sensing electrode 200 and the wire electrode 300.

The substrate 100 may have an active area AA and an unactive area UA defined therein.

An image may be displayed in the active area AA. The image is not displayed in the unactive area UA provided at a peripheral portion of the active area AA.

In addition, the position of an input device (e.g., finger) may be sensed in at least one of the active area AA and the unactive area UA. If the input device, such as a finger, touches the touch window, the variation of capacitance occurs in the touched part by the input device, and the touched part subject to the variation of the capacitance may be detected as a touch point.

The sensing electrode 200 may be provided on the substrate 100. A reflection protective layer 400 may be disposed on the sensing electrode 200. Top surfaces of the sensing electrode 200 and the reflective protective layer 400 may be disposed. The top surfaces of the sensing electrode 200 and the reflective protective layer 400 may correspond to each other, so that the sensing electrode 200 and the reflective protective layer 400 may have the same shape when viewed from the top. Hereinafter, a plan shape will be described as a representative of that of the sensing electrode 200.

In detail, the sensing electrode 200 may be disposed in at least one of the active area AA and the unactive area UA of the substrate 200. Preferably, the sensing electrode 200 may be disposed on the active area AA of the substrate.

The sensing electrode 200 may include a transparent conductive material that allows electricity to flow therethrough without interrupting transmission of light. For example, the sensing electrode 200 may include metal oxide such as indium tin oxide (ITO), indium zinc oxide (IZO), copper oxide, tin oxide, zinc oxide, or titanium oxide.

In addition, the sensing electrode 200 may include a nano wire, a photo sensitive nano wire film, a carbon nano tube (CNT), graphene, or conductive polymer.

In addition, the sensing electrode 200 may include various metals. For example, the sensing electrode 200 may include at least one of Cr, Ni, Cu, Al, Ag, Mo and the alloy thereof.

The sensing electrode 200 may be formed in a mesh shape. In detail, the sensing electrode 200 may include a plurality of sub-electrodes and the sub-electrodes may be disposed in the mesh shape while crossing each other.

In detail, referring to FIG. 1, the sensing electrode 200 may have a mesh line LA and a mesh opening part OA between mesh lines LA by the sub-electrodes crossing each other in the shape of a mesh. In this case, the line width of the mesh line LA may be in the range of about 0.1 μm to about 10 μm. If the line width of the mesh line LA is less than about 0.1 μm the mesh line may not be fabricated. If the line width of the mesh line LA exceeds about 10 μm a sensing electrode pattern is recognized from an outside, so that the visibility may be degraded. In addition, the line width of the mesh line LA may be in the range of about 1 μm to about 5 μm. In addition, the line width of the mesh line LA may be in the range of about 1.5 μm to about 3 μm.

The mesh opening part OA may have a rectangular shape, but the embodiment is not limited thereto. The mesh opening part OA may have various shapes such as a polygonal shape including a diamond shape, a pentagon shape, or a hexagonal shape, or a circular shape. In addition, the mesh opening part OA may have a regular shape or a random shape.

The sensing electrode 200 may have a mesh shape, so that the pattern of the sensing electrode may not be viewed on the active area AA. That is, even though the sensing electrode is formed of metal, the pattern may not be viewed. In addition, even if the sensing electrode is applied to a large-size touch window, the resistance of the touch window may be lowered.

The wire electrode 300 may be disposed on the substrate 100. In detail, the wire electrode 300 may be disposed on the unactive area UA of the substrate 100.

The wire electrode 300 may be connected to the sensing electrode 200 and may extend toward the unactive area UA, so that the wire electrode 300 may be connected to a printed circuit board on the unactive area UA.

The wire electrode 300 may include a material equal or similar to that of the sensing electrode 200. In detail, the wire electrode 300 may include metal oxide such as indium tin oxide (ITO), indium zinc oxide (IZO), copper oxide, tin oxide, zinc oxide, or titanium oxide, a material such as a nano wire, a photo sensitive nano wire film, a carbon nano tube (CNT) or graphene, conductive polymer, or a metal such as Cr, Ni, Cu, Al, Ag, Mo, Au, Ti and the alloy thereof.

The touch window will be described in detail as follows.

Referring to FIGS. 1 and 2, the reflection protective layer 400 is disposed on the sensing electrode 200. The reflection protective layer 400 may include a first reflection protective layer 410 disposed on a top surface 200a of the sensing electrode 200, and a second reflection protective layer 420 disposed on a side surface 200e of the sensing electrode 200.

The reflection protective layer 400 may include a material formed by oxidizing Cu, Au, Ag, Al, Ti, Ni, Cr, Pd or the alloy thereof.

According to the embodiment, the reflection protective layer 400 may include at least one of metal oxide, metal nitride, and metal oxynitride. Further, when the sensing electrode 200 includes first metal, the reflection protective layer 400 may include oxide with the first metal. In addition, the reflection protective layer 400 may include a darkening layer.

The reflection protective layer 400 according to the embodiment may be formed through a sputtering scheme. In this case, the reflectance of the reflection protective layer 400 may be controlled according to a ratio of gas used in a reactive sputtering process.

For example, when Ni is used as a metal for forming the reflection protective layer 400, the pressure is 5 mTorr, the used power is 1000 W, and Ar, $O_2$ and $N_2$ are used as reactive gas, the reflectance of the reflection protective layer 400 may be controllable according to the compositional ratios of Ar, $O_2$ and $N_2$ to each other. In detail, the reflectance of the reflection protective layer 400 formed through a deposition process while the ratios of $O_2$ and $N_2$ to Ar are changed has been examined as follows. When the ratio between $O_2$ and $N_2$ to Ar is 1:0.5:0.1, the reflectance is equal to 7%. When the ratio of $O_2$ and $N_2$ to Ar is 1:0.5:0.1, the reflectance is equal to 6%. In addition, when the ratio of $O_2$ and $N_2$ to Ar is 1:0.1:0.3~0.4, the reflectance is equal to 8~9%.

That is, since the reflection protective layer 400 according to the embodiment is formed through a deposition process after Cu, Au, Al, Ti, Ni, Cr, Pd or the alloy thereof is oxidized, the reflectance of the reflection protective layer 400 may be managed higher than 0% and equal to or less than 20%. Specifically, the reflectance of the reflection protective layer 400 may be managed higher than 2% and equal to or less than 15%. More specifically, the reflectance of the reflection protective layer 400 may be managed higher than 4% and equal to or less than 10%.

It is physically impossible to form the reflection protective layer 400 having a reflectance of 0% or less, and when the reflection protective layer 400 is formed to have a reflectance of 20% or above, the visibility is deteriorated due to the light reflection of the sensing electrode 200.

When the reflection protective layer 400 is formed through the reactive sputtering, there is a merit of being capable of easily forming the reflection protective layer 400 in various structures.

For example, according to an embodiment, the second reflection protective part 420 may be disposed on the side surface 200e of the sensing electrode 200. In this case, the second reflection protective part 420 may be disposed while making direct contact with the side surface 200e of the sensing electrode 200. The second reflection protective part 420 may be disposed while making direct contact with a part of the side surface 200e of the sensing electrode 200. In addition, the second reflection protective part 420 may prevent the side surface 200e of the sensing electrode 200 from reflecting light so that the visibility of the sensing electrode 200 is reduced.

Hereinafter, examples of the reflection protective layer 400 formed in various structures through the reactive sputtering process will be described.

Hereinafter, a touch window according to another embodiment will be described with reference to FIGS. 3 to 6. The details of structures or components the same as or similar to those of the above-described embodiments will be omitted for the purpose of convenience or clarity.

Figure 3:
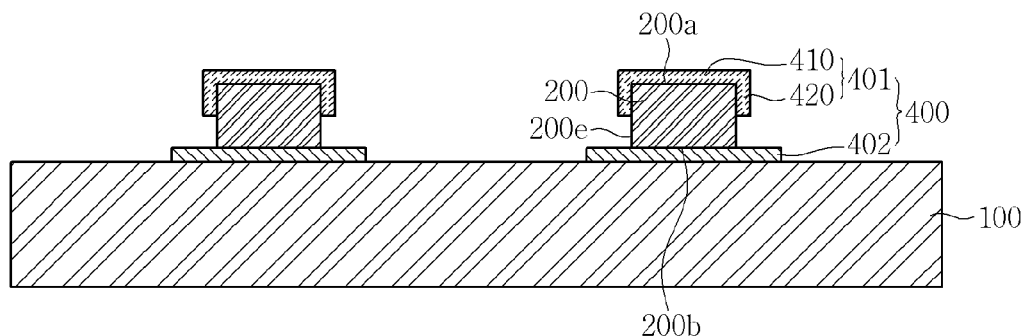
FIG. 3 is a sectional view taken along line B-B' of FIG. 1 according to another embodiment.

FIG. 3 is a sectional view showing a touch window according to another embodiment. The touch window according to another embodiment may include a reflection protective layer 400 including a top surface reflection protective layer 401 and a bottom surface reflection protective layer 402. The top surface reflection protective layer 401 may include a first reflection protective layer 410 disposed on a top surface 200a of the sensing electrode 200 and a second reflection protective layer 420 disposed on a side surface 200e of the sensing electrode 200.

In this case, an area of the top surface of the bottom surface reflection protective layer 402 is larger than that of the bottom surface of the sensing electrode 200. Thus, the bottom surface reflection protective layer 402 may cover the entire bottom surface of the sensing electrode 200.

The bottom surface reflection protective layer 402 may prevent the sensing electrode 200 from reflecting light even on the lower portion of the touch window as well as the upper portion of the touch window.

Figure 4:
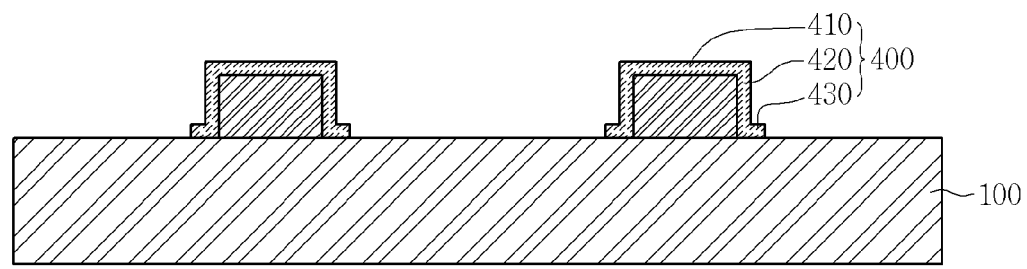
FIG. 4 is a sectional view taken along line B-B' of FIG. 1 according to still another embodiment.

Referring to FIG. 4, a reflection protective layer 400 according to another embodiment includes a first reflection protective part 410, a second reflection protective part 420 and a third reflection protective part 430. The third reflection protective part 430 is disposed on the top surface of the substrate 100. In this case, the third reflection protective part 430 may make direct contact with the top surface of the substrate 100.

The second reflection protective part 420 may perfectly prevent light from being reflected on the side surface 200e of the sensing electrode 200, so that the visibility of the touch window 10 may be improved.

Figure 5:
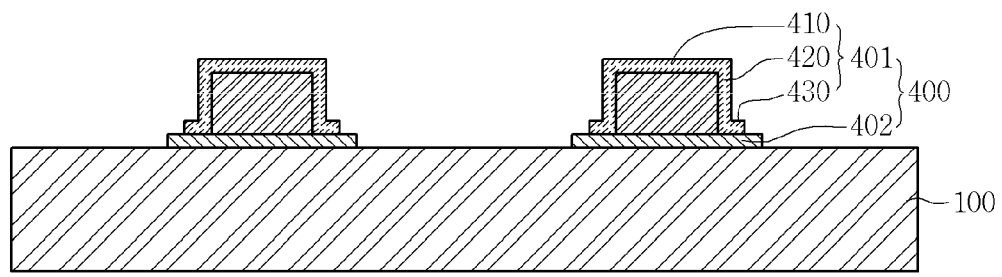
FIG. 5 is a sectional view taken along line B-B' of FIG. 1 according to still another embodiment.

Referring to FIG. 5, a reflection protective layer 400 according to still another embodiment includes a top surface reflection protective layer 401 and a bottom surface reflection protective layer 402. In this case, the top surface reflection protective layer 401 includes a first reflection protective part 410, a second reflection protective part 420 and a third reflection protective part 430. The third reflection protective part 430 is disposed on the bottom surface reflection protective layer 402. In this case, the third reflection protective part 430 may make direct contact with the top surface of the bottom surface reflection protective layer 402.

The reflection protective layer 400 according to the embodiment surrounds the sensing electrode 200 to prevent the sensing electrode 200 from reflecting light in all directions, so that the visibility of the touch window 10 may be improved.

Figure 6:
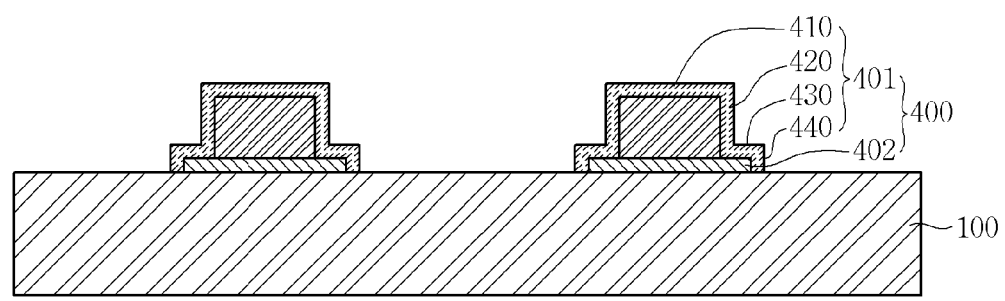
FIG. 6 is a sectional view taken along line B-B' of FIG. 1 according to still another embodiment.

Referring to FIG. 6, a reflection protective layer 400 according to still another embodiment includes a top surface reflection protective layer 401 and a bottom surface reflection protective layer 402. In this case, the top surface reflection protective layer 401 includes a first reflection protective part 410, a second reflection protective part 420, a third reflection protective part 430 and a fourth reflection protective part 440. The third reflection protective part 430 is disposed on the bottom surface reflection protective layer 402. In this case, the third reflection protective part 430 may be disposed on the top surface of the bottom surface reflection protective layer 402. The fourth reflection protective layer 440 may be disposed on the side surface of the bottom surface reflection protective layer 402. That is, the third and fourth reflection protective parts 430 and 440 may be disposed to surround the bottom surface reflection protective layer 402.

The reflection protective layer 400 allows the sensing electrode 200 and the substrate to adhere more closely to each other, so that the reliability may be improved.

Meanwhile, the sensing electrode 200 according to still another embodiment may be formed in a nano mesh shape.

Hereinafter, a touch window according to still another embodiment will be described with reference to FIG. 7. The details of structures or components the same as or similar to those of the above-described embodiments will be omitted for the purpose of convenience or clarity.

Figure 7:
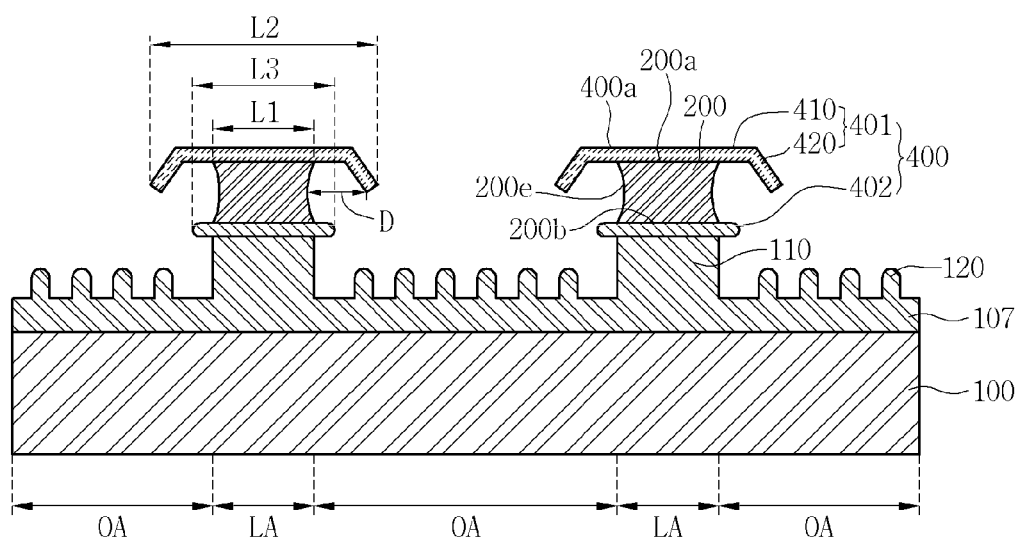
FIG. 7 is a sectional view taken along line B-B' of FIG. 1 according to still another embodiment.

Referring to FIG. 7, after a resin layer 107 including UV resin or a thermosetting resin layer 107 is formed on the substrate 100 and then, intaglio or embossed first and second sub-patterns 110 and 120 having a mesh shape are formed in the resin layer 107, at least one of Cr, Ni, Cu, Al, Ag, Mo, Au, Ti and the alloy thereof may be sputtered on the resin layer 107. In this case, the embossed patterns of the first and second sub-patterns 110 and 120 may be formed by imprinting a mold having an intaglio pattern, and the intaglio patterns may be formed by imprinting a mold having an embossed pattern. In this case, the first sub-pattern 110 may be formed larger than the second sub-pattern 120.

Then, the metal layer formed on the first and second sub-patterns 110 and 120 may be etched such that the metal layer on the second sub-pattern 120 is removed and the metal layer on the first sub-pattern 110 remains, thereby forming the sensing electrode 200 having the mesh shape. In this case, when the metal layer is etched, an etching rate may vary depending on the bonding area of the metal layer with respect to the first and second sub-patterns 110 and 120. That is, since the bonding area between the first sub-pattern 110 and the metal layer is wider than the bonding area between the second sub-pattern 120 and the metal layer, the electrode material formed on the first sub-pattern 110 may be less etched. Thus, as the etching process is performed at the same etch rate, the metal layer formed on the first sub-pattern 110 remains and the metal layer formed on the second sub-pattern 120 is etched to be removed, so that the sensing electrode 200 may be formed on the substrate corresponding to the embossed shape of the first sub-pattern 110.

That is, the sensing electrode 200 is disposed on the first sub-pattern 110. Thus, the sensing electrode 200 is disposed on the mesh line LA in a mesh shape.

In this case, the side surface of the sensing electrode 200 may be curved toward an inside of the sensing electrode 200. This shape is because the sensing electrode 200 is formed through depositing and etching processes.

Meanwhile, the reflection protective layer 400 may include a top surface reflection protective layer 401 and a bottom surface reflection protective layer 402.

In this case, an area of the top surface of the top surface reflection protective layer 401 is larger than that of the top surface of the sensing electrode 200. Thus, the top surface reflection protective layer 401 may cover the entire top surface of the sensing electrode 200.

In addition, a line width L2 of the top surface reflection protective layer 401 is larger than a line width L1 of the sensing electrode 200. That is, a length L2 of one sectional surface of the top surface reflection protective layer 401 is longer than a length L1 of one sectional surface of the sensing electrode 200. In detail, a ratio of the line width L2 of the top surface reflection protective layer 401 to the line width L1 of the sensing electrode 200 may be in the range of 1.3:1 to 2:1.

When the ratio of the line width L2 of the top surface reflection protective layer 401 to the line width L1 of the sensing electrode 200 is less than 1.3:1, it may be difficult for the top surface reflection protective layer 401 to sufficiently cover the top surface 200a of the sensing electrode 200, so that it may be difficult to achieve the reflection prevention. In addition, due to the manufacturing process, it may be difficult that the ratio of the line width L2 of the top surface reflection protective layer 401 to the line width L1 of the sensing electrode 200 is greater than 2:1.

A part of the top surface reflection protective layer 401 may be spaced apart from the sensing electrode 200. That is, a part of the top surface reflection protective layer 401 may be spaced apart from the sensing electrode 200 by a predetermined distance D.

In detail, the top surface reflection protective layer 401 may include a first reflection protective part 410 and a second reflection protective part 420. The second reflection protective part 420 may surround the first reflection protective part 410. The second reflection protective part 420 may be disposed at a periphery of the first reflection protective part 410. That is, the first reflection protective part 410 may be disposed on a top surface 200a of the sensing electrode 200. The second reflection protective part 420 extends from the first reflection protective part 410 to be disposed on the side surface 200e of the sensing electrode 200. In this case, the second reflection protective part 420 may be spaced apart from the side surface 200e of the sensing electrode 200. That is, the second reflection protective part 420 may be spaced apart from the side surface 200e of the sensing electrode 200 by a predetermined distance D without making contact with the side surface 200e of the sensing electrode 200.

The second reflection protective part 420 may be bendable from the first reflection protective part 410 toward the first reflection protective part 410. That is, the second reflection protective part 420 may be curved or bent downwardly from the first reflection protective part 410. Therefore, the end 400e of the reflection protective layer 400 may be disposed lower than a height of the top surface of the sensing electrode 200. Thus, the second reflection protective part 420 may surround the side surface 200e of the sensing electrode 200. Therefore, the second reflection protective part 420 may reduce the reflectance of the side surface 200e of the sensing electrode 200 and improve the visibility even at a wide viewing angle.

Meanwhile, the bottom reflection protective layer 402 is disposed on a bottom surface 200b of the sensing electrode 200. An area of a top surface of the bottom reflection protective layer 402 is larger than that of the bottom surface 200b of the sensing electrode 200. Thus, the bottom reflection protective layer 402 may entirely cover the bottom surface of the sensing electrode 200. In detail, a length L3 of one end surface of the bottom reflection protective layer 402 is longer than a length L1 of one end surface of the sensing electrode 200. In more detail, a ratio of a line width L3 of the bottom surface protective layer 402 to a line width L1 of the sensing electrode 200 may be in the range of 1.1:1 to 1.3:1.

When the ratio of the line width L3 of the bottom surface reflection protective layer 402 to the line width L1 of the sensing electrode 200 is less than 1.1:1, it may be difficult for the bottom surface reflection protective layer 402 to sufficiently cover the bottom surface of the sensing electrode 200, so that it may be difficult to achieve the reflection prevention. In addition, due to the manufacturing process, it may be difficult that the ratio of the line width L3 of the bottom surface reflection protective layer 402 to the line width L1 of the sensing electrode 200 is greater than 1.3:1.

The top and bottom surface reflection protective layers 401 and 402 may include mutually different metals. In detail, the top and bottom surface reflection protective layers 401 and 402 may include mutually different materials to allow the top and bottom surface reflection protective layers 401 and 402 to react with mutually different etching solutions. That is, the top and bottom surface reflection protective layers 401 and 402 may be selectively etched.

The reflection protective layer 400 may prevent the visibility from being increased due to the light reflection of the sensing electrode 200 including a metallic material. Specifically, as described above, the reflection protective layer 400 may reduce the reflectance of the side and bottom surfaces of the sensing electrode 200 as well as the top surface of the sensing electrode 200, so that the reflection protective layer 400 is beneficial to visibility. In addition, the visibility may be improved even at a wide viewing angle. Thus, an optical property of the sensing electrode 200 may be improved.

Hereinafter, touch windows according to various embodiments will be described with reference to FIGS. 8 to 15. The following description will be mainly focused on the elements different from those of FIG. 7 and the duplicate description will be omitted.

Figure 8:
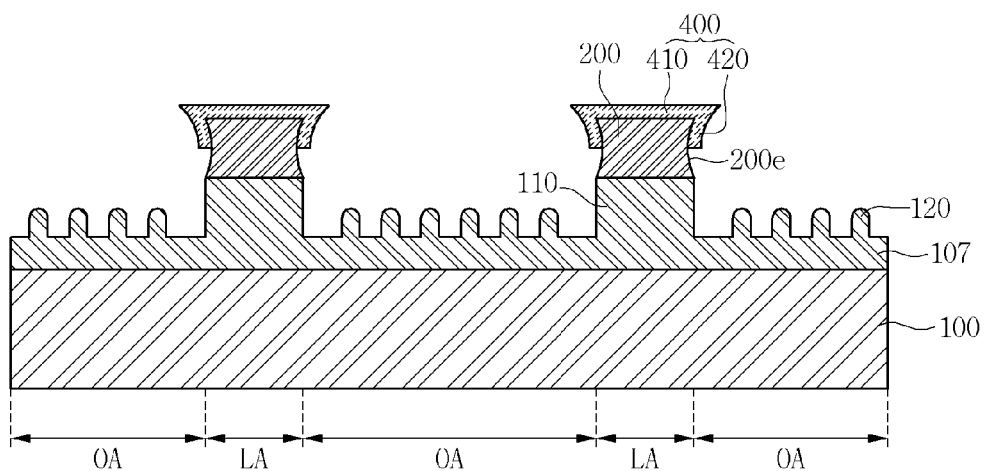
FIG. 8 is a sectional view taken along line B-B' of FIG. 1 according to still another embodiment.

Referring to FIG. 8, the sensing electrode 200 and the reflection protective layer 400 are disposed on the first sub-pattern 110, and the reflection protective layer 400 includes the first and second reflection protective parts 410 and 420. The second reflection protective part 420 is disposed on the side surface 200e of the sensing electrode 200. In this case, the second reflection protective part 420 may make direct contact with the side surface 200e of the sensing electrode 200. The second reflection protective part 420 may be disposed while making direct contact with a part of the side surface 200e of the sensing electrode 200.

Figure 9:
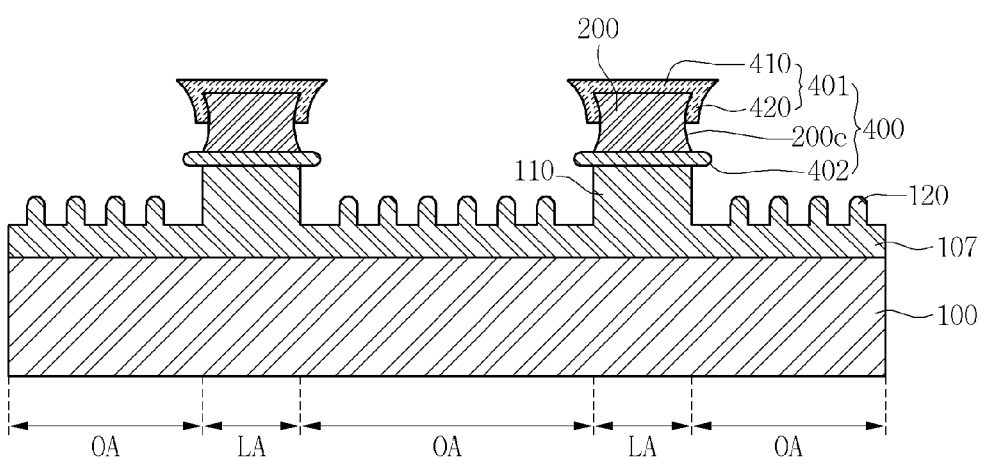
FIG. 9 is a sectional view taken along line B-B' of FIG. 1 according to still another embodiment.

Referring to FIG. 9, in the touch window structure shown in FIG. 8, the touch window may further include a bottom surface reflection protective layer 401 disposed on the bottom surface of the sensing electrode 200.

Figure 10:
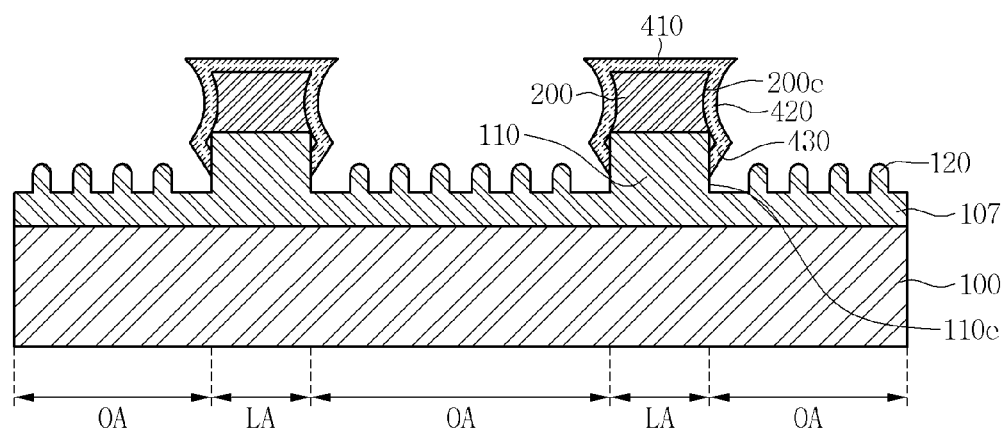
FIG. 10 is a sectional view taken along line B-B' of FIG. 1 according to still another embodiment.

Referring to FIG. 10, the second reflection protective part 420 may be disposed along the side surface 200e of the sensing electrode 200. In addition the third reflection protective part 430 may be disposed along the side surface 110e of the first sub-pattern 110.

The second and third reflection protective parts 420 and 430 may make direct contact with the side surfaces 200e and 110e of the sensing electrode 200 and the first sub-pattern 110, respectively.

Figure 11:
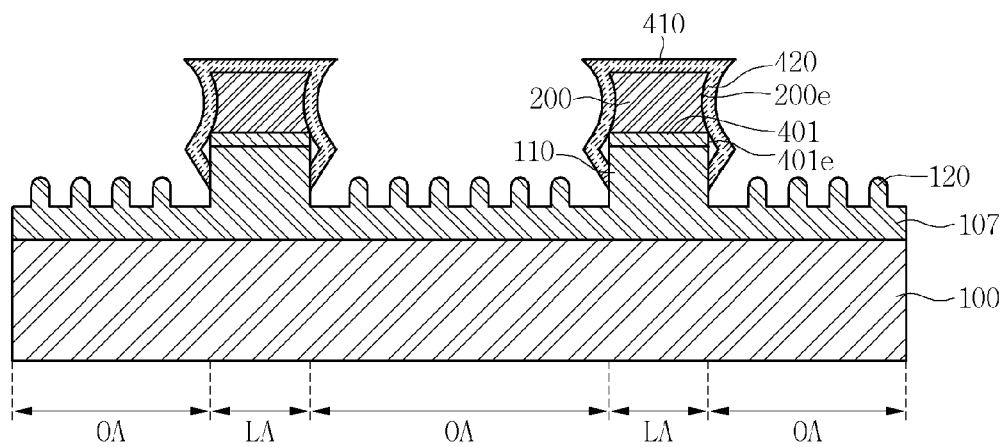
FIG. 11 is a sectional view taken along line B-B' of FIG. 1 according to still another embodiment.

Referring to FIG. 11, in the touch window structure shown in FIG. 10, the touch window may further include a bottom surface reflection protective layer 401 which is disposed on the bottom surface of the sensing electrode 200. The second and third reflection protective parts 420 and 430 may be disposed along the side surface 200e of the sensing electrode 200, the side surface 401e of the bottom surface reflection protective layer 401, and the side surface 110e of the first sub-pattern 110. The second and third reflection protective parts 420 and 430 may make direct contact with the side surface 200e of the sensing electrode 200, the side surface 401e of the bottom surface reflection protective layer 401, and the side surface 110e of the first sub-pattern 110.

Figure 12:
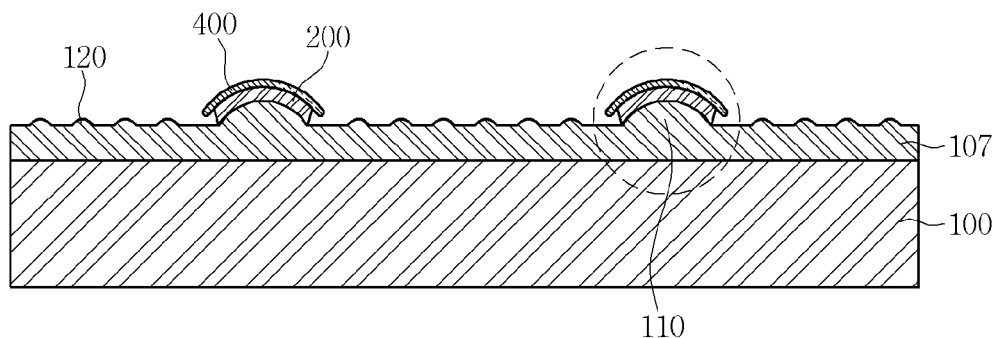
FIG. 12 is a sectional view taken along line B-B' of FIG. 1 according to still another embodiment.
Figure 13:
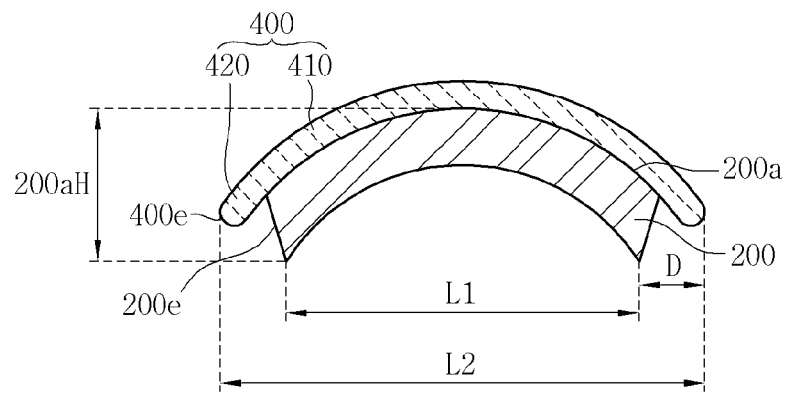
FIGS. 13 and 14 are views illustrating the touch window of FIG. 12.
Figure 14:
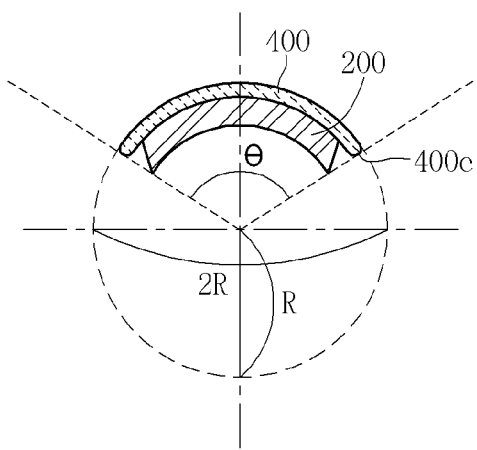

Referring to FIGS. 12 to 14, the first and second sub-patterns 110 and 120 may have at least partially curved shapes.

The sensing electrode 200 is disposed on the first sub-pattern 110. In this case, the sensing electrode 200 may have a shape corresponding to that of the first sub-pattern 110, that is, the at least partially curved shape. In addition, the sensing electrode 200 may be disposed on the mesh line LA so that the sensing electrode 200 may be disposed in a mesh shape.

In addition, the reflection protective layer 400 may be disposed on the sensing electrode 200.

The reflection protective layer 400 may be disposed on the first sub-pattern 110 and disposed on the top surface of the sensing electrode 200. Thus, the reflection protective layer 400 may have a shape corresponding to that of the first sub-pattern 110, that is, the at least partially curved shape. The reflection protective layer 400 may be disposed on the mesh line LA so that the reflection protective layer 400 may be disposed in a mesh shape. In detail, reflection protective layer 400 may be disposed on the top surface 400a of the sensing electrode 200. The reflection protective layer 400 may have a shape corresponding to that of sensing electrode 200, so that reflection protective layer 400 may have the at least partially curved shape.

An area of the top surface of the top surface reflection protective layer 401 is larger than that of the top surface of the sensing electrode 200. Thus, the top surface reflection protective layer 401 may cover the entire top surface of the sensing electrode 200.

In addition, a line width L2 of the reflection protective layer 400 is larger than a line width L1 of the sensing electrode 200. That is, a length L2 of one sectional surface of the reflection protective layer 400 is longer than a length L1 of one sectional surface of the sensing electrode 200.

In detail, a ratio of the line width L1 of the sensing electrode 200 to the line width L2 of the reflection protective layer 400 may be in the range of 1:1.3 to 1:2.

When the ratio of the line width L2 of the reflection protective layer 400 to the line width L1 of the sensing electrode 200 is less than 1.3:1, it may be difficult for the reflection protective layer 400 to sufficiently cover the top surface 400a of the sensing electrode 200, so that it may be difficult for the reflection protective layer 400 to achieve the reflection prevention.

In addition, due to the manufacturing process, it may be difficult that the ratio of the line width L2 of the reflection protective layer 400 to the line width L1 of the sensing electrode 200 is greater than 2:1.

Meanwhile, a part of the reflection protective layer 400 may be spaced apart from the sensing electrode 200. That is, the part of the reflection protective layer 400 may be spaced apart from the sensing electrode 200 by a predetermined distance D.

In detail, the reflection protective layer 400 may include the first and second reflection protective parts 410 and 420.

The second reflection protective part 420 may surround the first reflection protective part 410. The second reflection protective part 420 may be disposed at a periphery of the first reflection protective part 410. The first reflection protective part 410 may be disposed on the top surface 400a of the sensing electrode 200. The second reflection protective part 420 extends from the first reflection protective part 410 to be disposed on the side surface 200e of the sensing electrode 200. In this case, the second reflection protective part 420 may be spaced apart from the side surface 200e of the sensing electrode 200.

That is, the second reflection protective part 420 may be spaced apart from the side surface 200e of the sensing electrode 200 by a predetermined distance D without making contact with the side surface 200e of the sensing electrode 200.

The second reflection protective part 420 may be bendable from the first reflection protective part 410 toward the first reflection protective part 410. That is, the second reflection protective part 420 may be curved or bent downwardly from the first reflection protective part 410. Therefore, the end 400e of the reflection protective layer 400 may be disposed lower than a height 200aH of the top surface 200a of the sensing electrode 200. Thus, the second reflection protective part 420 may surround the side surface 200e of the sensing electrode 200. Therefore, the second reflection protective part 420 may reduce the reflectance of the side surface 200e of the sensing electrode 200 and improve the visibility even at a wide viewing angle.

Meanwhile, as described above, the reflection protective layer 400 may have at least partially curved shape to correspond to those of the first sub-pattern 110 and the sensing electrode 200.

As one example of the curved shape, the reflection protective layer 400 may have a hemispherical shape to correspond to those of the first sub-pattern 110 and the sensing electrode 200. Thus, when the reflection protective layer 400 has a hemispherical shape, the diameter 2R of the reflection protective layer 400 may satisfy following inequality 1:

$$\rightarrow 0.1 < \frac{1 um}{2R} \leq 10 \qquad \text{Inequality 1}$$

When the line width of the mesh line LA is in the range of 0.1 μm to 10 μm, the reflection protective layer 400 may have a diameter 2R in the range of 0.1 μm to 10 μm. Thus, the diameter 2R may satisfy an inequality of 0.1<1 um/R≤10.

In inequality 1, when a value of 1 um/R is less than 0.1, the curvature is too much increased, so that the line width of the mesh line LA must be reduced. However, since it is difficult to manufacture the mesh line LA such that the mesh line LA has a line width of 0.1 μm or less, it is preferable that the line width of the mesh line LA is in the range of 0.1 μm to 10 μm. Thus, it is also preferable that a value of 1 um/2R with respect to the diameter 2R of the reflection protective layer 400 is equal to or more than 0.1 μm. In addition, when a value of 1 um/2R with respect to the diameter 2R of the reflection protective layer 400 is equal to or more than 10, since it is the same as a case that a curvature does not almost exist, in order to achieve a target effect of an embodiment, it is preferable that a value of 1 um/2R with respect to the diameter 2R of the reflection protective layer 400 is equal to or less than 10 μm.

In addition, taking the reflection protective layer 400 as one circle, the angle between the center of the circle and the end 400e of the reflection protective layer 400, that is, the angle (θ) by an arc of the reflection protective layer 400 may be configured in three stages of the ranges of 45 degrees to 180 degrees, 90 degrees to 170 degrees and 120 degrees to 150 degrees. When the angle (θ) is in the range of 120 degrees to 150 degrees, the reflection protective layer 400 is effective in the visibility prevention.

Such a value is determined by taking into consideration cases that it is difficult to manufacture the mesh line width LA because the curvature is too great when the angle (θ) by the arc is equal to or less than 45 degrees and the visibility protection effect is not achieved because it is almost the same as a case that a curvature does not almost exist when the angle (θ) by the arc exceeds 180 degrees. Thus, the effect of the embodiment may have threshold significance in the range of the values proposed above.

When an angle formed by both ends of the reflection protective layer 400 is equal to the angle (θ) proposed above, even when viewed in all directions, the sensing electrode 200 may be prevented from being viewed.

The reflection protective layer 400 may prevent the visibility from being increased due to the light reflection of the sensing electrode 200 including a metallic material.

In addition, the reflection protective layer 400 may reduce the reflectance of the side surface of the sensing electrode 200 as well as that of the top surface of the sensing electrode 200, so that the reflection protective layer 400 is beneficial to visibility. In addition, the visibility may be improved even at a wide viewing angle. Thus, an optical property of the sensing electrode 200 may be improved.

Figure 15:
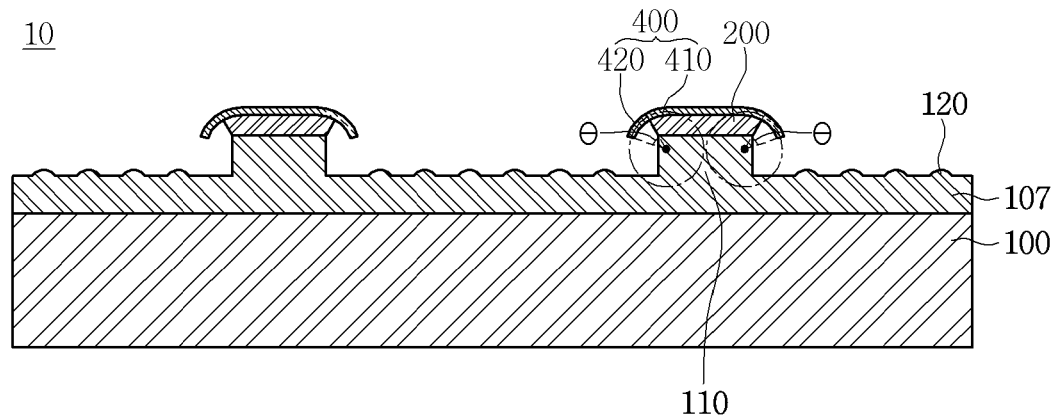
FIG. 15 is a sectional view taken along line B-B' of FIG. 1 according to still another embodiment.

Referring to FIG. 15, in the structure of the touch window shown in FIG. 12, the shapes of the first and second reflection protective parts 410 and 420 may be varied.

The first sub-pattern 110 and the sensing electrode 200 may have flat top surfaces. Thus, the first reflection protective part 410 disposed on the top surface of the sensing electrode 200 may have a flat shape.

The second reflection protective part 410 extending from the first reflection protective part 420 may be bendable toward the substrate 100. That is, the second reflection protective part 420 may be curved or bent downwardly from the first reflection protective part 410.

The reflection protective layer 400 is disposed on the sensing electrode 200. The reflection protective layer 400 may be disposed on the top surface 200a of the sensing electrode 200.

Figure 16:
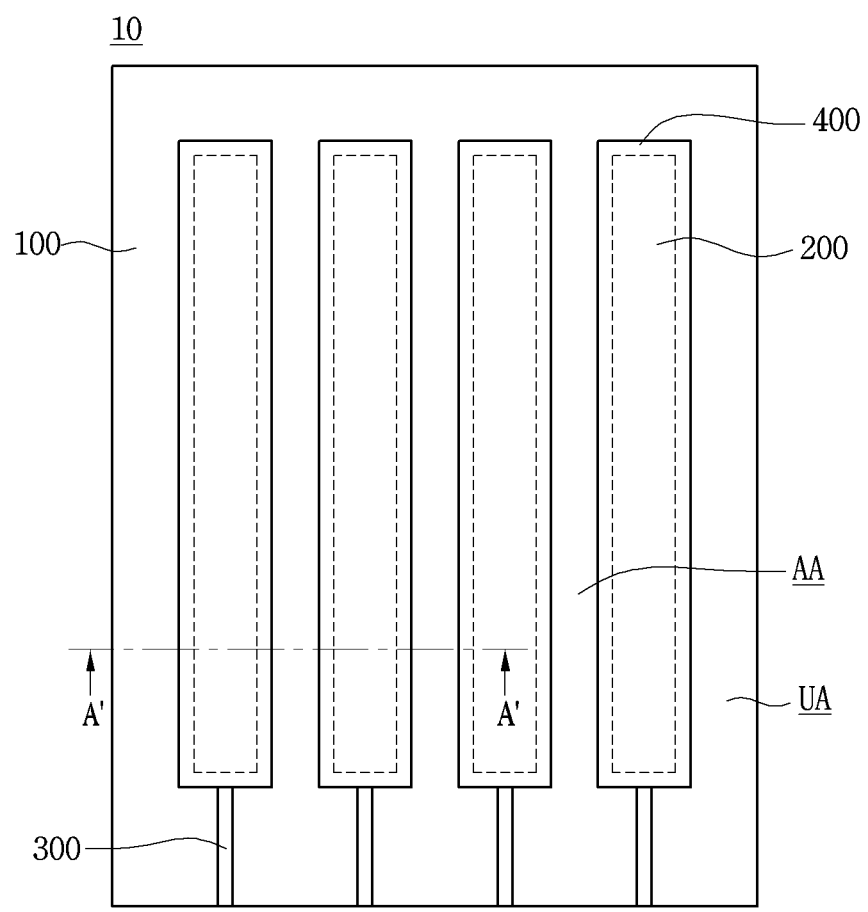
FIG. 16 is a plan view of a touch window according to still another embodiment.
Figure 17:
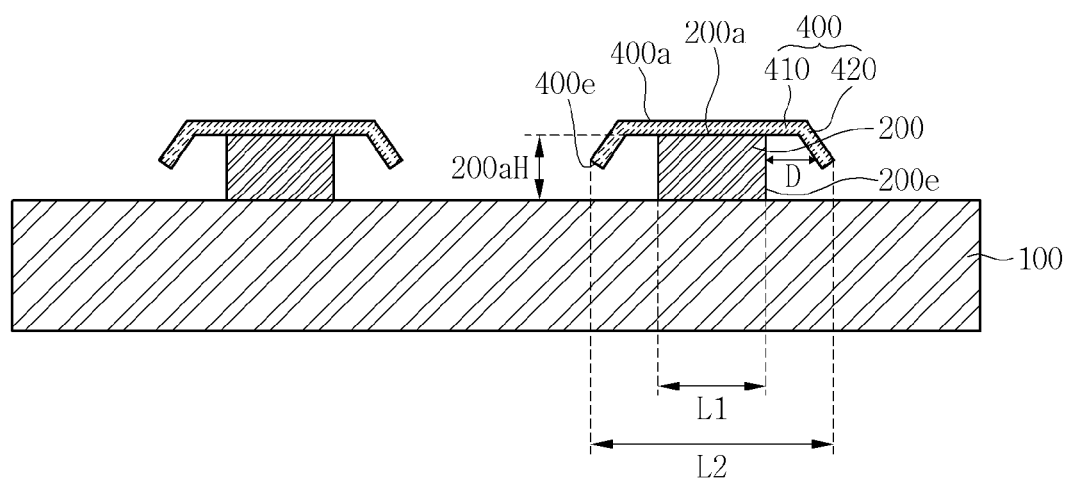
FIG. 17 is a sectional view taken along line A-A' of FIG. 16.
Figure 18:
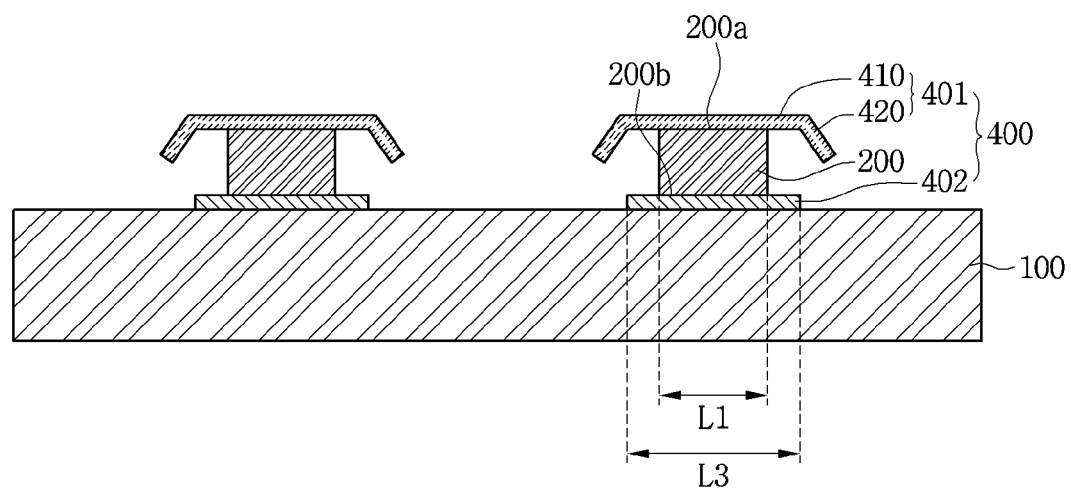
FIG. 18 is a sectional view taken along line A-A' of FIG. 16 according to still another embodiment.
Figure 19:
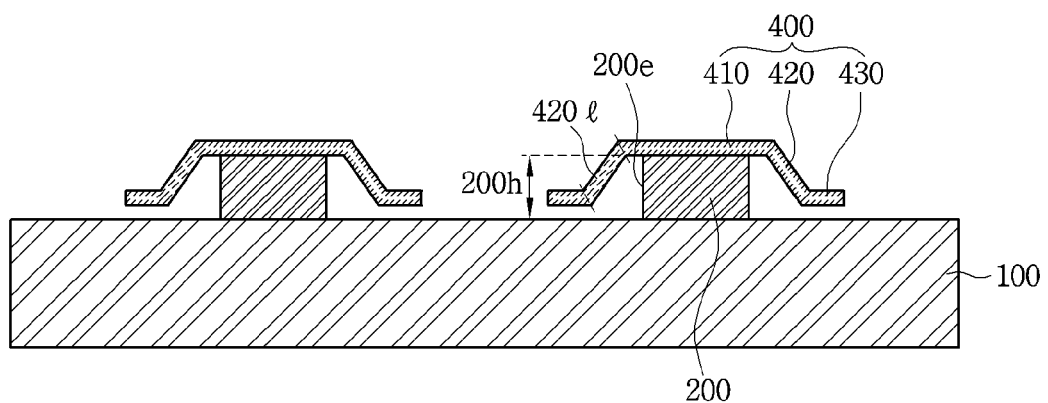
FIG. 19 is a sectional view taken along line A-A' of FIG. 16 according to still another embodiment.

FIG. 16 is a plan view of a touch window according to still another embodiment. FIGS. 17 to 19 are sectional views taken along line A-A' of FIG. 16, which includes reflection protective layers according to each embodiment.

Hereinafter, the structure of a touch window according to still another embodiment will be described with reference to FIGS. 16 to 19.

First, referring to FIG. 16, the sensing electrode 200 may be formed on the substrate 100. The sensing electrode 200 may sense whether the input device such as a finger is touched thereon. FIG. 1 shows the sensing electrode 200 extending on the substrate 100 in one direction, but the embodiment is not limited thereto. Accordingly, the sensing electrode 200 may extend in another direction crossing the one direction. In addition, the sensing electrode 200 may include two types of sensing electrodes having shapes extending in the directions.

The reflection protective layer 400 may be disposed on the sensing electrode 200.

Referring to FIG. 17, an area of the top surface 400a of the reflection protective layer 400 is larger than that of the top surface 200a of the sensing electrode 200. Thus, the reflection protective layer 400 may entirely cover the top surface 200a of the sensing electrode 200.

In addition, the line width L2 of the reflection protective layer 400 is larger than the line width L1 of the sensing electrode 200. That is, the length L2 of one sectional surface of the reflection protective layer 400 is longer than the length L1 of one sectional surface of the sensing electrode 200. In detail, a ratio of the line width L2 of the refection protective layer 400 to the line width L1 of the sensing electrode 200 may be in the range of 1.3:1 to 2:1. When the ratio of the line width L2 of the reflection protective layer 400 to the line width L1 of the sensing electrode 200 is less than 1.3:1, it may be difficult for the reflection protective layer 400 to sufficiently cover the top surface 200a of the sensing electrode 200, so that it may be difficult to achieve the reflection prevention. In addition, due to the manufacturing process, it may be difficult that the ratio of the line width L2 of the reflection protective layer 400 to the line width L1 of the sensing electrode 200 is greater than 2:1.

Meanwhile, a part of the reflection protective layer 400 may be spaced apart from the sensing electrode 200. That is, a part of the reflection protective layer 400 may be spaced apart from the sensing electrode 200 by a predetermined distance D.

In detail, the reflection protective layer 400 may include a first reflection protective part 410 and a second reflection protective part 420. The second reflection protective part 420 may surround the first reflection protective part 410. The second reflection protective part 420 may be disposed at a periphery of the first reflection protective part 410. The first reflection protective part 410 may be disposed on the top surface 200a of the sensing electrode 200. The second reflection protective part 420 extends from the first reflection protective part 410 to be disposed on the side surface 200e of the sensing electrode 200. In this case, the second reflection protective part 420 may be spaced apart from the side surface 200e of the sensing electrode 200. That is, the second reflection protective part 420 may be spaced apart from the side surface 200e of the sensing electrode 200 by the predetermined distance D without making contact with the side surface 200e of the sensing electrode 200.

The second reflection protective part 420 may be bendable toward the first reflection protective part 410 toward the first reflection protective part 410. That is, the second reflection protective part 420 may be curved or bent downwardly from the first reflection protective part 410. Therefore, the end 400e of the reflection protective layer 400 may be disposed lower than a height 200aH of the top surface 200a of the sensing electrode 200. Thus, the second reflection protective part 420 may surround the side surface 200e of the sensing electrode 200. Therefore, the second reflection protective part 420 may reduce the reflectance of the side surface 200e of the sensing electrode 200 and improve the visibility even at a wide viewing angle.

Referring to FIG. 18, a reflection protective layer 400 according to still another embodiment includes a top surface reflection protective layer 401 and a bottom surface reflection protective layer 402.

The top surface reflection protective layer 401 is disposed on the top surface 200a of the sensing electrode 200. The top surface reflection protective layer 401 is equal or similar to the reflection protective layer 400 included in the touch window according to the first embodiment described above.

The bottom surface reflection protective layer 402 is disposed on the bottom surface 200b of the sensing electrode 200. An area of the top surface of the bottom surface reflection protective layer 402 is larger than that of the bottom surface of the sensing electrode 200. Thus, the bottom surface reflection protective layer 402 may entirely cover the bottom surface of the sensing electrode 200.

In addition, the line width L3 of the bottom surface reflection protective layer 402 is larger than the line width L1 of the sensing electrode 200. That is, the length L3 of one sectional surface of the bottom surface reflection protective layer 402 is longer than the length L1 of one sectional surface of the sensing electrode 200. In detail, the ratio of the line width L3 of the bottom surface reflection protective layer 402 to the line width L1 of the sensing electrode 200 may be in the range of 1.1:1 to 1.3:1. When the ratio of the line width L3 of the bottom surface reflection protective layer 402 to the line width L1 of the sensing electrode 200 is less than 1.1:1, it may be difficult for the bottom surface reflection protective layer 402 to sufficiently cover the bottom surface of the sensing electrode 200, so that it may be difficult to achieve the reflection prevention. In addition, due to the manufacturing process, it may be difficult that the ratio of the line width L3 of the bottom surface reflection protective layer 402 to the line width L1 of the sensing electrode 200 is greater than 1.3:1.

As well as the upper portion of the touch window, the visibility may be prevented from being increased even at the lower portion of the touch window by the bottom surface reflection protective layer 402. Thus, the visibility of the entire touch window may be improved.

Referring to FIG. 19, a reflection protective layer 400 according to still another embodiment includes a first reflection protective part 410, a second reflection protective part 420 and a third reflection protective part 430.

The first reflection protective part 410 is disposed on the top surface of the sensing electrode 200.

The second reflection protective part 420 is bent from the first reflection protective part 410 so that the second reflection protective part 420 is disposed on the side surface 200e of the sensing electrode 200. A length 420l may be longer than or at least equal to a height 200h of the sensing electrode 200. Thus, the second reflection protective part 420 may perfectly cover the side surface 200e of the sensing electrode 200.

The third reflection protective part 430 extends and is bent from the second reflection protective part 420 so that the third reflection protective part 430 is disposed on the side surface 200e of the sensing electrode 200. The third reflection protective part 430 may be spaced apart from the substrate 100.

Figure 20:
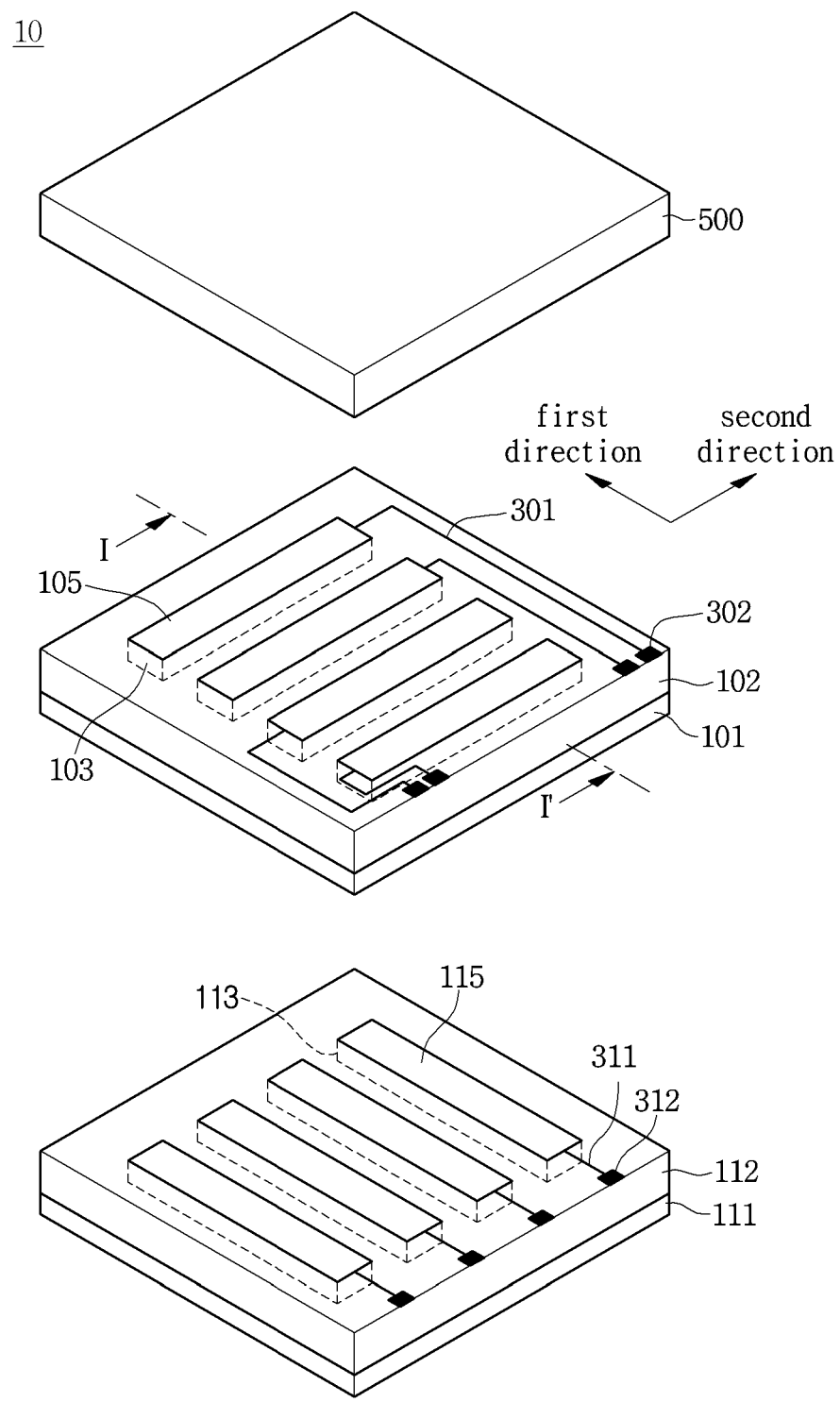
FIG. 20 is a plan view of a touch window according to still another embodiment.
Figure 23:
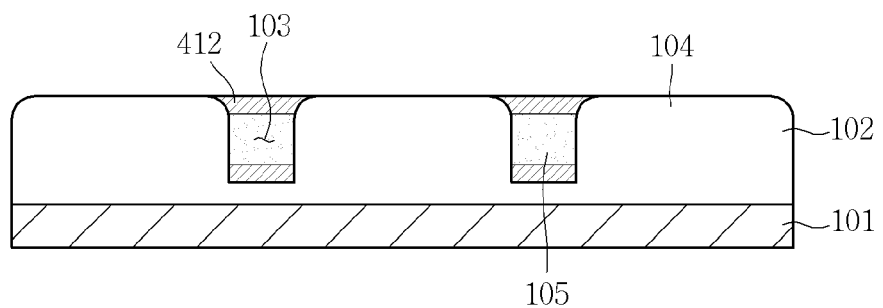
FIG. 23 is a sectional view of FIG. 22.

FIGS. 20 and 23 are plan and sectional views of a touch window according to still another embodiment.

Figure 21:
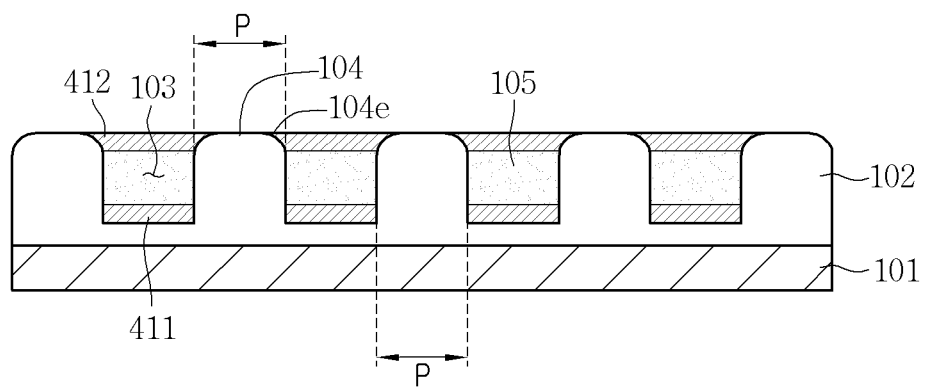
FIG. 21 is a sectional view of FIG. 20.

Referring to FIGS. 20 and 21, the touch window may include a cover substrate 500 for protecting elements disposed under the cover substrate 500, a first substrate 101, a first sensing electrode 105 formed on the substrate 101, a first wire 301 and a first pad part 302.

A second substrate 111 may be disposed under the first substrate 101. A second base substrate 112 is disposed on the second substrate 111. An intaglio part 113 of the second substrate 111, a second sensing electrode 115, a second wire 311 and a second pad part 312 may be disposed on the second base substrate 112.

The second sensing electrode 115 may be formed while crossing the first sensing electrode 105.

The first base substrate 102 may be disposed on the first substrate 101. The first base substrate 102 may include intaglio parts 103 and embossed parts 104. The intaglio parts may be formed through an imprinting scheme. That is, the intaglio parts 103 may be formed by performing an imprinting operation after a mold is placed on resin.

The first sensing electrode 105 is disposed on the active area AA of the first substrate 101. The first sensing electrode 105 may sense a position of an input device.

The first sensing electrode 105 may extend in a second direction. Although the first sensing electrode 105 is shown in a bar sharp in FIG. 17, the embodiment is not limited thereto.

Thus, the first sensing electrode 105 may be formed in various shapes which can sense the touch of the input device such as a finger.

The first sensing electrode 105 may be disposed in the intaglio parts 103. That is, the first sensing electrode 105 may be formed by filling the intaglio parts 103 with a sensing electrode material. Therefore, the number, time and cost of processes may be reduced as compared with the deposition and photograph processes according to the related art.

Meanwhile, the embossed parts 104 may be interposed between the intaglio parts 103. In addition, the embossed parts 104 results from the intaglio parts 103.

The embossed parts 104 may include round parts 104e roundly formed thereon, respectively. The round part 104e may be disposed adjacently to the intaglio part 110. That is, the round part 104e is provided at an edge of the embossed part 104. Thus, the round part 104e may be disposed on an end of the embossed part 104. In addition, the round part 104e may be provided on the entire top surface of the embossed part 104.

The round part 104e may be formed on the embossed part 104 through surface treatment. For example, the round part 104e may be formed by exposing the embossed part 104 to etching solution for a predetermined time.

A width P of the embossed part 104 may be in the range of 1 μm to 3000 μm. Thus, the touch sensitivity of the sensing electrodes disposed in the intaglio parts 103 may be improved and the noise may be reduced. In this case, have the width P of the embossed part 104 is enough to include the round part 104e.

Meanwhile, the bottom and top surface reflection protective layers 402 and 401 may be disposed in the intaglio parts 103 and 113 on the first and second substrate 101 and 111.

The bottom surface reflection protective layer 402 may be disposed on the bottom surfaces of the first and second sensing electrodes 105 and 115, and the top surface reflection protective layer 401 may be disposed on the top surfaces of the first and second sensing electrodes 105 and 115.

As described above, the first and second sensing electrodes 105 and 115 respectively formed on the first and second substrates 101 and 111 has been described, but the embodiment is not limited thereto. That is, the first sensing electrode 105 may be formed on the top surface of a single substrate and the second sensing electrode 115 may be formed on the bottom surface of the single substrate.

Figure 22:
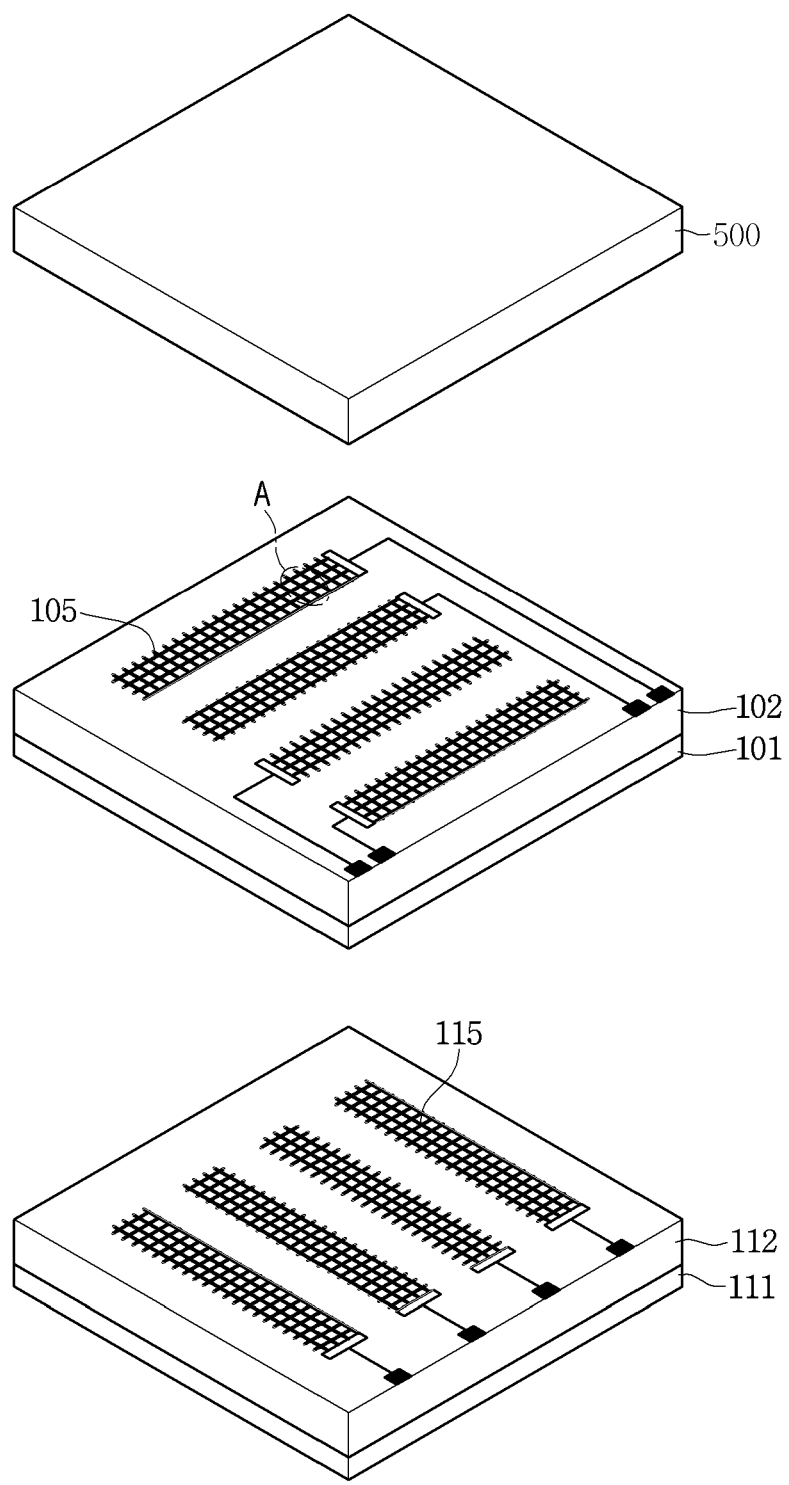
FIG. 22 is a plan view of a touch window according to still another embodiment.

Referring to FIGS. 22 and 23, the first and second sensing electrodes 105 and 115 may be disposed in a mesh shape. In this case, the mesh pattern may be formed in random to prevent a moiré phenomenon. The moiré phenomenon occurs when periodical stripes overlap with each other. Since adjacent stripes overlap with each other, a thickness of a stripe is thickened so that the stripe is spotlighted as compared with other stripes. Thus, in order to prevent such a moiré phenomenon, the conductive pattern may be provided in various shapes.

In addition, at least one of the bottom and top surface reflection protective layers 402 and 401 may be disposed in the intaglio parts 103 and 113 on the first and second substrate 101 and 111.

The bottom surface reflection protective layer 402 may be disposed on the bottom surfaces of the first and second sensing electrodes 105 and 115, and the top surface reflection protective layer 401 may be disposed on the top surfaces of the first and second sensing electrodes 105 and 115.

Figure 25:
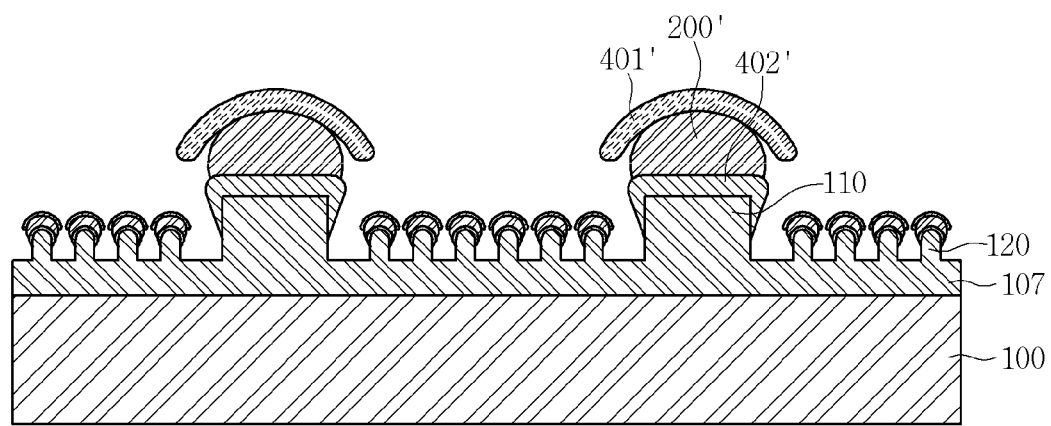
Figure 26:
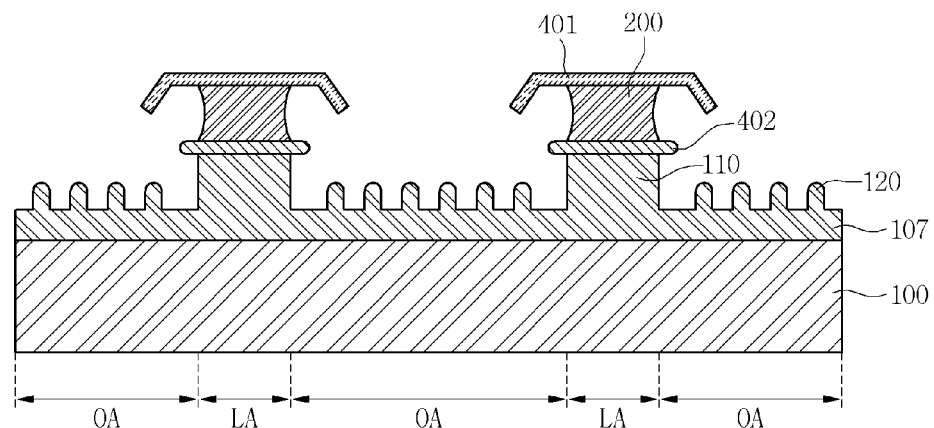

Hereinafter, a method of manufacturing a touch window according to an embodiment with reference to FIGS. 24 to 26.

Figure 24:
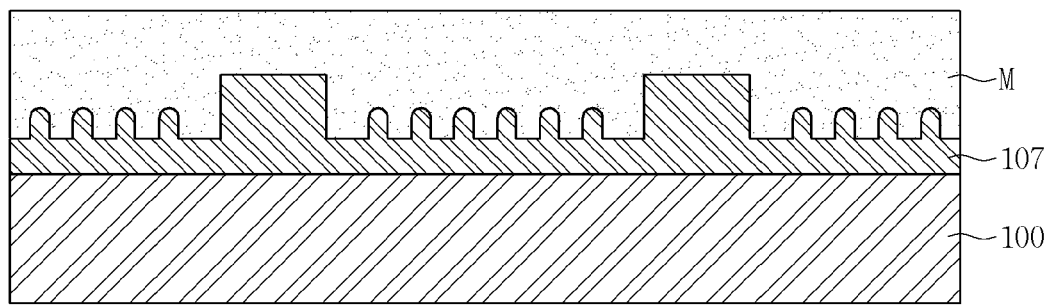
FIGS. 24 to 26 are sectional views illustrating a method of manufacturing a touch window according to an embodiment.

First, referring to FIG. 24, a mold M on which a pattern is formed may be disposed and imprinted on a resin layer 107'.

Referring to FIG. 22, a resin layer 107 including the first and second sub-patterns 110 and 120 may be formed through the imprinting process, and a bottom surface reflection protective material 402' may be formed on the first and second sub-patterns 110 and 120. The bottom surface reflection protective material 402' may be formed through a deposition process, and the sensing electrode 200' may be formed on the bottom surface reflection protective material 402'. The sensing electrode 200' may be formed through a deposition process.

In addition, a top surface reflection protective material 401' may be formed on the sensing electrode 200'. The top surface reflection protective material 401' may be formed by the deposition process.

A scheme of depositing the bottom surface reflection protective and top surface reflection protective materials 402' and 401' includes a reactive sputtering scheme.

The sputtering deposition scheme is a method of oxidizing a metallic material separated from a target, by which the metallic material is changed into a material having a chemical structure different from that of the metallic material to induce the deposition.

When the metal has a very thin thickness such as 1 μm or less, it is preferable to perform the deposition through the reactive sputtering scheme instead of a wet etching scheme.

According to the sputtering scheme, gas supplied into a chamber collides with electrons generated from a cathode (target), so ions are accelerated toward the cathode due to a great potential difference to collide with a surface of the cathode, so that neutral cathode atoms are produced to form a thin film on the substrate 100.

In the reactive sputtering scheme, the properties of the bottom surface reflection protective material 402' and the top surface reflection protective material 401' may vary depending on a ratio of the used gases and partial pressure.

For example, when the partial pressure of oxygen of used gases is too low, the metallic material is not sufficiently oxidized on the substrate 100, so that the desired bottom surface reflection protective material 402' and top surface reflection protective material 401' may not be obtained. When the partial pressure of oxygen is too high, the metallic material is oxidized on the surface of a target, so that the deposition rate may be decreased.

In addition, the reflectance of the bottom surface reflection protective material 402' and the top surface reflection protective material 401' may vary depending on the ratio of the used gas and partial pressure.

TABLE 1

| Argon (Ar) | Oxygen ($O_2$) | Nitrogen ($N_2$) | Reflectance (%) |
|---|---|---|---|
| 1 | 0.1 | 0.1 | 12 |
| 1 | 0.1 | 0.2 | 13 |
| 1 | 0.1 | 0.3 | 8 |
| 1 | 0.1 | 0.4 | 9 |
| 1 | 0.1 | 0.5 | 11 |
| 1 | 0.5 | 0.1 | 6 |
| 1 | 0.4 | 0.1 | 7 |
| 1 | 0.3 | 0.1 | 12 |
| 1 | 0.2 | 0.1 | 10 |

Table 1 shows the variations of the reflectance of the bottom surface reflection protective I and top surface reflection protective materials 402' and 401' according to the ratio of the gases used in the reactive spurting. The reflectance is an average reflectance in the entire visual light wavelength of 380 nm to 780 nm.

Referring to Table 1, nitride (Ni) serves as the used metal, the pressure is 5 mTorr, the used power is 1000 W, and Ar, $O_2$ and $N_2$ serve as the reactive gas.

In detail, when examining the reflectance of the bottom surface reflection protective and top surface reflection protective materials 402' and 401' formed through a deposition process while changing the ratio of $O_2$ and $N_2$ under the condition that the ratio of Ar is set to 1, the reflectance is 7% when the ratio of Ar, $O_2$, and $N_2$ is set to 1:0.4:0.1. When the ratio of Ar, $O_2$ and $N_2$ is set to 1:0.5:0.1, the reflectance is 6%. In addition, when the ratio of Ar, $O_2$ and $N_2$ is 1:0.1:0.3-0.4, the reflectance is 8~9%.

That is, when the reactive sputtering is performed with the ratios proposed in Table 1, the bottom surface reflection protective and top surface reflection protective materials 402' and 401' having reflectance of 20% or less may be obtained. Therefore, it may be understood that the reflection prevention effect is excellent when the bottom surface reflection protective and top surface reflection protective materials 402' and 401' are deposited according to the proposed values.

As described above, the materials included in the reflection protective layer 400 are formed by oxidizing Cu, Au, Al, Ti, Ni, Cr, Pd or the alloy thereof. Generally, the above metallic materials have high reflectance.

In detail, when the reflection protective layer 400 is formed by using Ag, Al and Au instead of ITO, if the metal is Ag/Al, the reflectance is 90% or more at the visible ray band (380~810 nm). When the metal is Au, the reflectance is 38% or more, so there is a problem in visibility. However, the reflectance of the reflection protective layer 400 may be controlled higher than 0% and equal to or less than 20% through the deposition scheme according to the embodiment described above.

Thus, a suitable metal may be used for the reflection protective layer 400 instead of ITO having a problem of high cost and difficulty in application to a flexible product. In addition, the high reflectance phenomenon, which may be caused when using a metal for the reflection protective layer 400, may be improved through the deposition scheme described above. Therefore, the touch window according to the embodiment may have remarkable effects.

In the experiment of the embodiment, although Ar, $O_2$ and $N_2$ are proposed as an example, the bottom surface reflection protective and top surface reflection protective materials 402' and 401' may be deposited by using $CO_2$.

The method of forming the bottom surface reflection protective and top surface reflection protective materials 402' and 401' described above is not limited to the forming of the bottom surface reflection protective and top surface reflection protective materials 402' and 401', but the same method may be utilized for forming a reflection protective layer of another embodiment.

Referring to FIG. 23, the bottom surface reflection protective material 402' and the sensing electrode 200' may be etched. In this case, the bottom surface reflection protective material 402' and the sensing electrode 200' may be etched through a single etching process. That is, the bottom surface reflection protective material 402' and the sensing electrode 200' may be etched by using one etching solution. In this case, the top surface reflection protective material 401' may not be etched by the etching solution. That is, the top surface reflection protective material 401' includes a material which reacts with another etching solution different from the etching solution for the bottom surface reflection protective material 402' and the sensing electrode 200', so that an selective etching may be performed.

When the metal layer is etched, an etching area may vary depending on the bonding area of the sensing electrode 200' with respect to the structures of the first and second sub-patterns 110 and 120. That is, since the bonding area between the first sub-pattern 110 and the sensing electrode 200' is wider than the bonding area between the second sub-pattern 120 and the sensing electrode 200', the sensing electrode 200' formed on the first sub-pattern 110 may be less etched. That is, as the etching process is performed at the same etch rate, the sensing electrode 200' formed on the first sub-pattern 110 remains and the sensing electrode 200' formed on the second sub-pattern 120 is etched to be removed. Thus, the top surface reflection protective material 401' formed on the second sub-pattern 120 and the bottom surface reflection protective material 402' may be also lifted off to be removed. Therefore, the bottom surface reflection protective layer 402, the electrode layer 210 and the top surface reflection protective layer 401 may be formed only the first sub-pattern 110, and the electrode layer 210 may be formed in a mesh shape. In addition, as described above, since the top surface reflection protective material 401' is not etched, a line width of the top surface reflection protective layer 401 may be wider than that of the electrode layer 210 or the bottom surface reflection protective layer 402.

Figure 27:
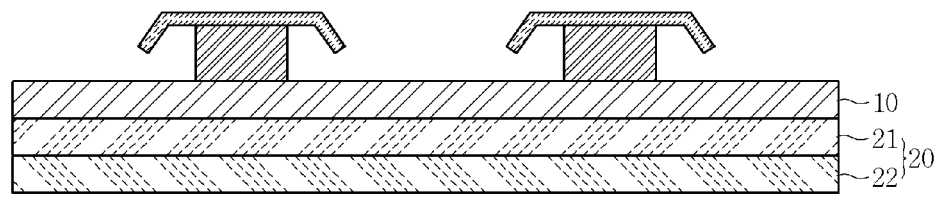
FIGS. 27 to 30 are sectional views showing a display device in which a touch window according to an embodiment is disposed on a display panel.

Meanwhile, referring to FIG. 27, the touch window 10 may be disposed on a display panel 20 serving as a driver. The touch window 10 may be combined with the display panel 20, so that a display device may be implemented.

A display region to output an image is formed in the display panel 20. A display panel applied to the display device may generally include an upper substrate 21 and a lower substrate 22. A data line, a gate line and a thin-film transistor (TFT) may be formed in the lower substrate 22. The upper substrate 21 may be adhesive to the lower substrate 22 such that the elements provided on the lower substrate 22 may be protected.

The display panel 20 may be formed in various types according to the type of a display device. That is, the display device according to the embodiment may include a liquid-crystal device (LCD), a field emission display, a plasma display panel (PDP), an organic light-emitting diode (OLED), and an electronic paper display (EPD). Thus, the display panel 20 may be implemented in various types.

The touch window 10 may be combined with the display panel, so that a display device may be implemented. The display device may include a mobile terminal.

Specifically, the touch window 10 according to the embodiment may include a curved touch window. A display device including the curved touch window may include a curved display device.

The touch window 10 may include a flexible touch window. Thus, the display device including the touch window may be a flexible touch device. Therefore, a user may flex or bend the display device with his hand.

Figure 28:
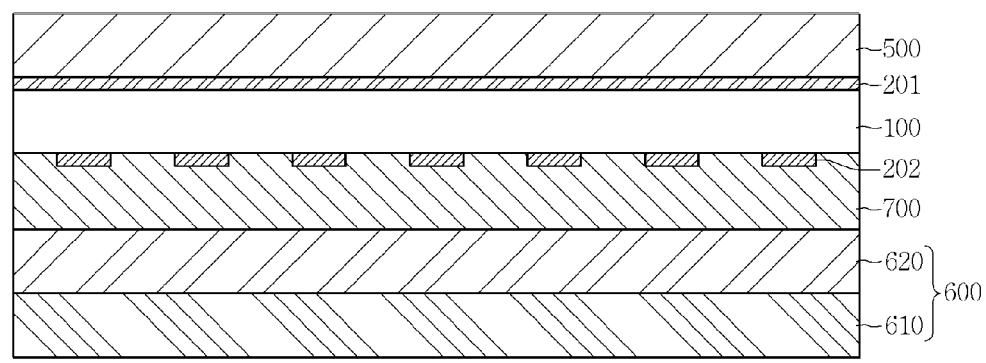

Referring to FIG. 28, a touch device according to the embodiment may include a touch panel integrated with a display panel 600. That is, a substrate for supporting at least one sensing electrode may be omitted.

In detail, at least one sensing electrode may be disposed on at least one surface of the display panel 600. That is, at least one sensing electrode may be formed on at least one surface of the first or second substrate 610 or 620.

In this case At least one sensing electrode may be formed on a top surface of the substrate disposed at an upper portion.

Referring to FIG. 12, the first sensing electrode 201 may be disposed on one surface of the substrate 100. In addition, the first wire connected to the first sensing electrode 201 may be disposed. The second sensing electrode 202 may be disposed on one surface of the display panel 600. Further, the second wire connected to the second sensing electrode 202 may be disposed.

An adhesive layer 700 is interposed between the substrate 100 and the display panel 600, so that the substrate 100 and the display panel 600 may be combined with each other.

In addition, a polarizing plate may be further provided under the substrate. The polarizing plate may be a linear polarizing plate or an anti-reflection polarizing plate. For example, when the display panel 600 is a liquid crystal display panel, the polarizing plate may be a linear polarizing plate. In addition, when the display panel 600 is an organic electroluminescent display panel, the polarizing plate may be an anti-reflection polarizing plate.

A touch device according to an embodiment may allow at least one substrate supporting a touch device to be omitted. For this reason, a touch device having a thin thickness and a light weight may be formed.

Figure 29:
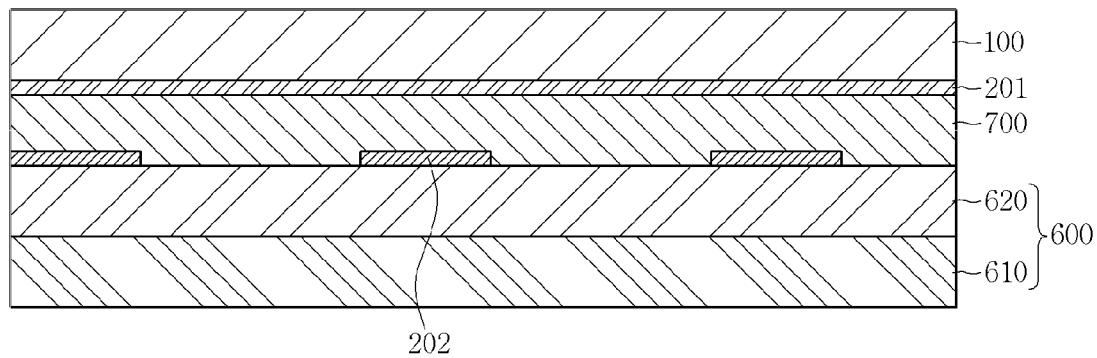

Referring to FIG. 29, a touch device according to still another embodiment may include a touch panel integrated with a display panel 600. That is, a substrate for supporting at least one sensing electrode may be omitted.

For example, an electrode, which serves as a sensor disposed in an active area to sense a touch, and a wire, through which an electrical signal is applied to the sensing electrode, may be formed inside the display panel. In detail, at least one electrode or at least one wire may be formed inside the display panel.

The display panel includes first and second panel substrates 610 and 620. In this case, at least one of the first and second sensing electrodes 201 and 202 is disposed between the first and second panel substrates 610 and 620. That is, at least one sensing electrode may be formed on at least one surface of the first or second panel substrate 610 or 620.

Figure 30:
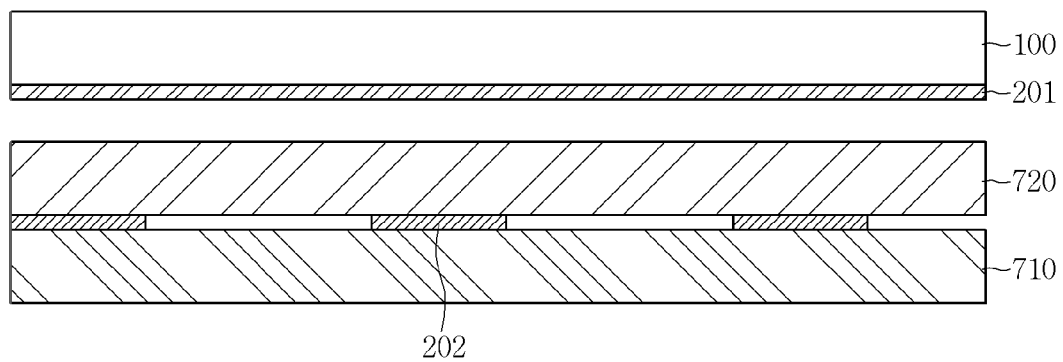

Referring to FIG. 30, the first sensing electrode 201 may be formed on one surface of the substrate 100. In addition, the first wire connected to the first sensing electrode 201 may be disposed on the substrate 100. Further, the second sensing electrode 202 and the second wire may be formed between the first and second panel substrates 610 and 620. That is, the second sensing electrode 202 and the second wire may be disposed inside the display panel, and the first sensing electrode 201 and the first wire may be disposed outside the display panel.

The second sensing electrode 202 and the second wire may be disposed on the top surface of the first panel substrate 610 or the rear surface of the second panel substrate 620.

In addition, a polarizing plate may be further included at a lower portion of the substrate 100.

When the display panel is a liquid crystal display panel and the sensing electrode is formed on the top surface of the first substrate 2100, the sensing electrode may be formed with a thin film transistor (TFT) and a pixel electrode. In addition, when the sensing electrode is formed on the rear surface of the second substrate 2200, a color filter layer may be formed on the sensing electrode or the sensing electrode may be formed on the color filter layer. When the display panel is an organic light emitting device and the sensing electrode is formed on the top surface of the first substrate 2100, the sensing electrode may be formed with a thin film transistor or an organic light emitting device.

The touch device according to another embodiment may allow at least one substrate supporting a sensing electrode to be omitted. For this reason, the touch device having a thin thickness and a light weight may be formed. In addition, the sensing electrode and the wire are formed with a device formed on the display panel, so that the process may be simplified and the cost may be reduced.

The display panel 30 may be formed in various types according to the type of touch device. That is, the touch device according to the embodiment may include a liquid-crystal device (LCD), a field emission display, a plasma display panel (PDP), an organic light-emitting diode (OLED), and an electronic paper display (EPD). Thus, the display panel 20 may be implemented in various types.

Figure 31:
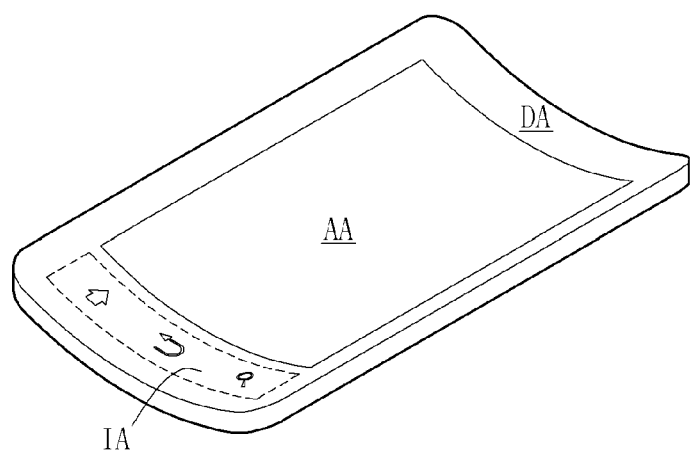
FIGS. 31 to 34 are views showing a touch device to which a touch window according to an embodiment is applied.

Referring to FIG. 31, the touch window 10 may be combined with the display panel, so that a display device may be implemented. The display device may include a mobile terminal.

Specifically, the touch window 10 according to the embodiment may include a curved touch window. A display device including the curved touch window may include a curved display device.

Figure 32:
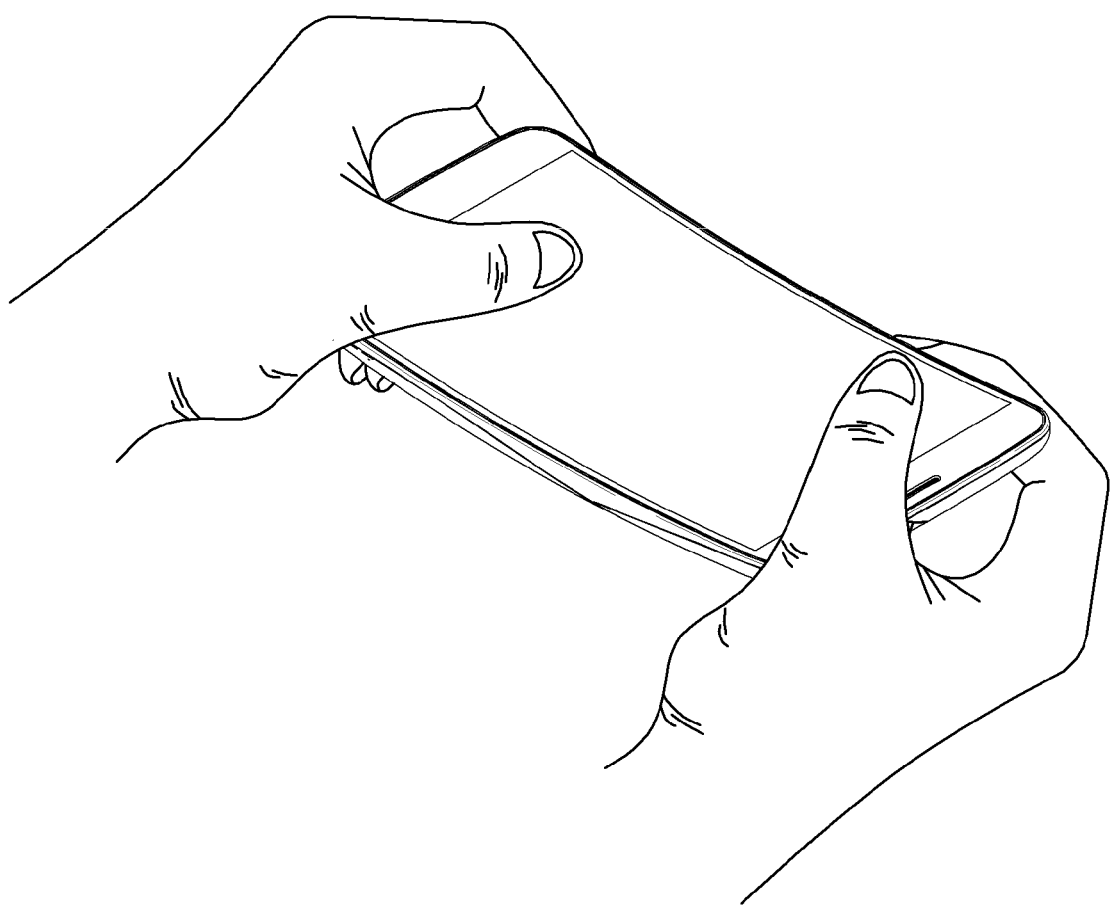

Meanwhile, referring to FIG. 32, the touch window 10 may include a flexible touch window. Thus, the display device including it may be a flexible touch device. Therefore, a user may flex or bend the display device with his hand.

Figure 33:
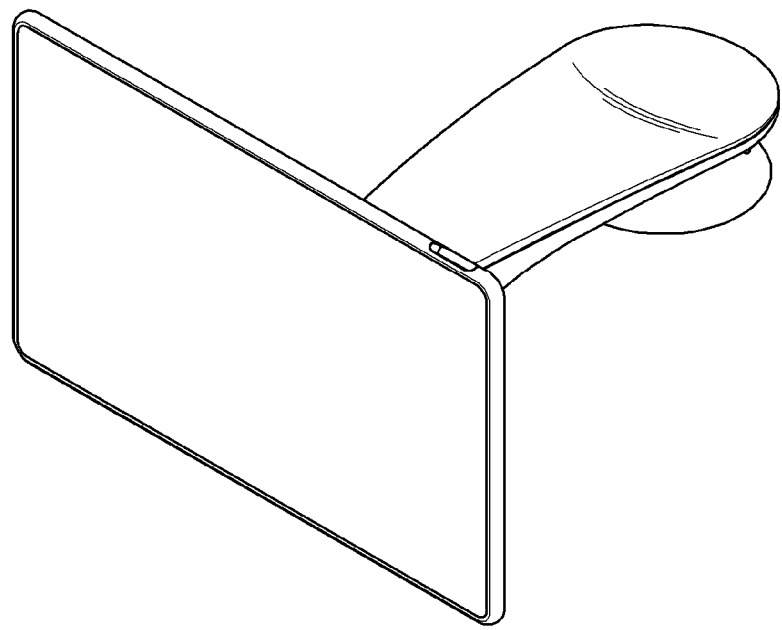
Figure 34:
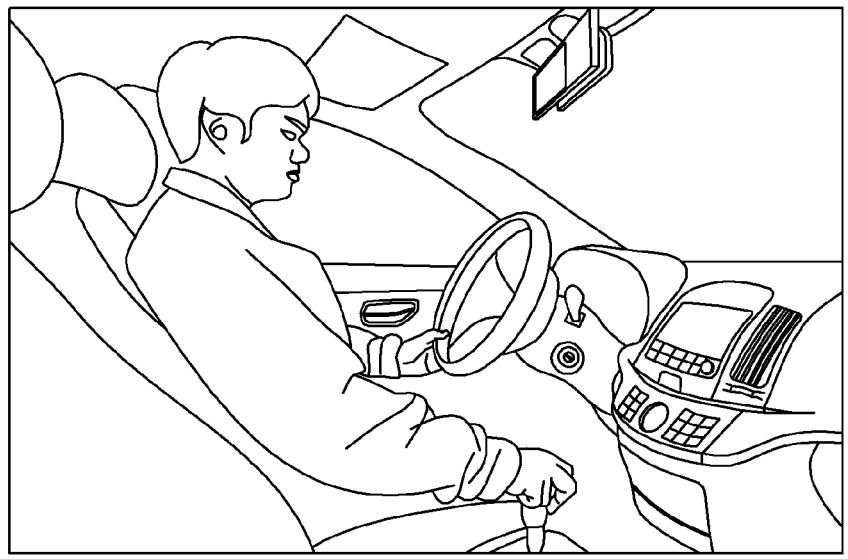

Meanwhile, referring to FIGS. 33 and 34, the touch window 10 may be applied to a vehicle navigation system as well as a mobile terminal. Although the vehicle navigation system is depicted in the drawings, the embodiment is not limited thereto. Accordingly, the touch window is applied to a dashboard as well as a PND (Personal Navigation Display) so that a CID (Center Information Display) may be implemented. However, the embodiment is not limited to the embodiment. In other words, the display may be used in various electronic products.

The embodiment is to provide a touch window having improved visibility.

According to the embodiment, there is provided a touch window which includes: a substrate; a sensing electrode on the substrate; and a reflection protective layer on the sensing electrode, wherein a reflectance of the reflection protective layer is higher than 0% and equal to or less than 20%.

According to the embodiment, the reflection protective layer is disposed on a bottom surface of the sensing electrode.

The touch window according to the embodiment includes the reflection protective layer, an area of a top surface of which is larger than that of a top surface of the sensing electrode. The reflection protective layer may prevent the visibility from being increased due to the light reflection of the sensing electrode including a metallic material. Specifically, the reflection protective layer may reduce the reflectance of the side surface of the sensing electrode as well as the top surface of the sensing electrode, so that the reflection protective layer is beneficial to visibility. In addition, the visibility may be improved even at a wide viewing angle. Thus, an optical property of the sensing electrode may be improved. In addition, since the reflection protective layer is deposited through a reactive sputtering scheme, even though the metal thickness is very thin, the reflection protective layer can be formed, and the reflectance of the reflection protective layer may be managed by controlling a ratio of reaction gas.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch window comprising:
   a substrate;
   a sensing electrode on the substrate; and
   a reflection protective layer on the sensing electrode,
   wherein a reflectance of the reflection protective layer is higher than 0% and equal to or less than 20%,
   wherein the reflection protective layer includes a top surface reflection protective layer disposed on a top surface of the sensing electrode, and
   a bottom surface reflection protective layer disposed on a bottom surface of the sensing electrode,
   wherein an area of a top surface of the top surface reflection protective layer is larger than an area of the top surface of the sensing electrode,
   wherein an area of a top surface of the bottom surface reflection protective layer is larger than an area of the bottom surface of the sensing electrode, and
   wherein the bottom surface reflection protective layer is disposed between the substrate and the sensing electrode.

2. The touch window of claim 1, wherein the reflection protective layer is formed by oxidizing Cu, Au, Ag, Al, Ti, Ni, Cr, Pb or an alloy thereof.

3. The touch window of claim 1, wherein the reflection protective layer includes a first reflection protective part disposed on a top surface of the sensing electrode; and
   a second reflection protective part extending from the first reflection protective part and disposed on at least a part of a side surface of the sensing electrode.

4. The touch window of claim 3, wherein the second reflection protective part surrounds the side surface of the sensing electrode, and
   the touch window further comprises a third reflection protective part extending from the second reflection protective part and disposed on the substrate, and
   wherein the third reflection protective part makes direct contact with the top surface of the bottom surface reflection protective layer.

5. The touch window of claim 1, wherein the reflection protective layer includes a first reflection protective part disposed on a top surface of the sensing electrode, and
   a second reflection protective part surrounding an outer periphery of the first reflection protective part, and
   wherein the second reflection protective part is spaced apart from a side surface of the sensing electrode.

6. The touch window of claim 5, wherein the second reflection protective layer is bent from the first reflection protective part toward the substrate.

7. The touch window of claim 1, wherein the top surface reflection protective layer includes a first reflection protective part disposed on the top surface of the sensing electrode, and
a second reflection protective part extending from the first reflection protective part and disposed on at least a part of a side surface of the sensing electrode.

8. The touch window of claim 1, wherein the substrate includes intaglio parts and an embossed part interposed between the intaglio parts, and
the sensing electrode is disposed on the intaglio part.

9. A touch window comprising:
a substrate;
a resin layer disposed on the substrate and including a first sub-pattern and a second sub-pattern;
a sensing electrode disposed on the first sub-pattern of the resin layer and having a mesh pattern; and
a reflection protective layer on the sensing electrode,
wherein a reflectance of the reflection protective layer is higher than 0% and equal to or less than 20%,
wherein the reflection protective layer includes a top surface reflection protective layer disposed on a top surface of the sensing electrode, and
a bottom surface reflection protective layer disposed on a bottom surface of the sensing electrode,
wherein an area of a top surface of the top surface reflection protective layer is larger than an area of the top surface of the sensing electrode,
wherein an area of a top surface of the bottom surface reflection protective layer is larger than an area of the bottom surface of the sensing electrode,
a ratio of a line width of the top surface reflection protective layer to a line width of the sensing electrode is in the range of 1.3:1 to 2:1, and
a ratio of a line width of the bottom surface protective layer to a line width of the sensing electrode is in the range of 1.1:1 to 1.3:1.

10. The touch window of claim 9, wherein the reflection protective layer is formed by oxidizing Cu, Au, Ag, Al, Ti, Ni, Cr, Pb or an alloy thereof.

11. The touch window of claim 9, wherein the reflection protective layer includes a first reflection protective part disposed on a top surface of the sensing electrode; and
a second reflection protective part extending from the first reflection protective part and disposed on at least a part of a side surface of the sensing electrode.

12. The touch window of claim 11, wherein the second reflection protective part surrounds the side surface of the sensing electrode, and
the touch window further includes a third reflection protective part extending from the second reflection protective part and disposed on the substrate.

13. The touch window of claim 11, wherein the second reflection protective layer is bent from the first reflection protective part toward the substrate and is spaced apart from a side surface of the sensing electrode.

14. The touch window of claim 9, wherein the top surface reflection protective layer includes a first reflection protective part disposed on a top surface of the sensing electrode, and
a second reflection protective part extending from the first reflection protective layer and disposed on at least a part of a side surface of the sensing electrode.

15. The touch window of claim 9, where an area of a top surface of the reflection protective layer is larger than an area of a top surface of the sensing electrode, and at least a part of the reflection protective layer is curved.

16. The touch window of claim 9, wherein the reflection protective layer has a hemispherical shape.

* * * * *